(12) United States Patent
Mok et al.

(10) Patent No.: US 8,531,202 B2
(45) Date of Patent: Sep. 10, 2013

(54) PROBE CARD TEST APPARATUS AND METHOD

(75) Inventors: Sammy Mok, Cupertino, CA (US);
Frank Swiatowiec, San Jose, CA (US);
Fariborz Agahdel, Los Gatos, CA (US)

(73) Assignee: VeraConnex, LLC, San Jose, CA (US)

( * ) Notice: Subject to any disclaimer, the term of this patent is extended or adjusted under 35 U.S.C. 154(b) by 595 days.

(21) Appl. No.: 12/682,391

(22) PCT Filed: Oct. 10, 2008

(86) PCT No.: PCT/US2008/011667
§ 371 (c)(1),
(2), (4) Date: Apr. 9, 2010

(87) PCT Pub. No.: WO2009/048618
PCT Pub. Date: Apr. 16, 2009

(65) Prior Publication Data
US 2010/0213960 A1    Aug. 26, 2010

Related U.S. Application Data

(60) Provisional application No. 60/979,328, filed on Oct. 11, 2007.

(51) Int. Cl.
*G01R 31/26* (2006.01)

(52) U.S. Cl.
USPC .................................................. 324/762.03

(58) Field of Classification Search
USPC ................. 324/762.01–762.1, 754.01–754.3, 324/755.01–755.11
See application file for complete search history.

(56) References Cited

U.S. PATENT DOCUMENTS

| | | | |
|---|---|---|---|
| 4,918,374 A | 4/1990 | Stewart et al. | |
| 5,657,394 A | 8/1997 | Schwartz et al. | |
| 5,932,323 A | 8/1999 | Throssel | |
| 6,118,894 A | 9/2000 | Schwartz et al. | |
| 6,456,103 B1 * | 9/2002 | Eldridge et al. | 324/762.03 |
| 6,621,262 B2 | 9/2003 | Strom | |
| 6,842,029 B2 * | 1/2005 | Howland | 324/750.25 |
| 7,038,474 B2 | 5/2006 | McGinnis et al. | |
| 7,078,926 B2 | 7/2006 | Khandros et al. | |
| 7,102,368 B2 | 9/2006 | Strom | |
| 7,170,307 B2 | 1/2007 | Strom | |
| 7,782,071 B2 | 8/2010 | Endres | |
| 2003/0099097 A1 | 5/2003 | Mok et al. | |
| 2005/0232269 A1 | 10/2005 | Yao et al. | |
| 2006/0170435 A1 | 8/2006 | Granicher et al. | |
| 2006/0244438 A1 | 11/2006 | Strom | |
| 2006/0273809 A1 | 12/2006 | Miller et al. | |
| 2007/0096093 A1 | 5/2007 | Bhalla et al. | |
| 2007/0257686 A1 | 11/2007 | Beijert | |

* cited by examiner

*Primary Examiner* — Tung X Nguyen
(74) *Attorney, Agent, or Firm* — David T. Millers

(57) ABSTRACT

A probe card analyzer mounts on a probe card in a wafer prober and a use a fixture in the wafer probe and switch electronics in place of an ATE head. Methods of testing can confirm that probe cards are operating within their specifications over large temperature ranges and the mechanical force ranges seen in real manufacturing environments. This reduces the cost and improves the accuracy and speed of analyzing probe cards and improves diagnosing problems with probe cards.

25 Claims, 17 Drawing Sheets

PROBE CARD TEST APPARATUS AND METHOD

CROSS-REFERENCE TO RELATED APPLICATIONS

This patent document claims benefit of the earlier filing date of U.S. provisional patent application No. 60/979,328 filed Oct. 11, 2007.

FIELD OF INVENTION

This application relates to measurement and analysis of Integrated Circuit (IC) wafer probe cards.

BACKGROUND

Integrated circuits (ICs) are manufactured and tested in wafer form before being diced from the wafer and mounted in packages, modules, or directly on a printed circuit board. Wafer level IC testing is a critical part of the IC manufacturing process that identifies ICs that do not function properly and provides feedback for improving product design and reducing manufacturing cost. Wafer level IC testing also prevents non-functioning ICs from going through the cost of packaging and in some applications can be used for stress testing or burn-in testing at high temperature to screen ICs to improve long term reliability.

Conventional wafer IC testing uses probe cards to provide an electrical path between a test system and the pads on integrated circuits while in wafer form. Probe cards generally have electrical contact points (probe tips) that match the size and density of the electrical pads on an integrated circuit and conductive patterns that provide fan-out of electrical signals from these high density probes to the lower density connectors on the much larger printed circuit boards that interface to the IC tester. The probe card is typically held in place on a wafer prober, which moves the wafer into position to make an electrical connection between the IC pads and the probe tips on the probe card. After the integrated circuit or an array of integrated circuits has been aligned by the prober and has been electrically tested, the prober steps the IC wafer to the next integrated circuit or array of integrated circuits so that the next set of tests can be performed. The prober generally uses automatic pattern recognition optics to align the IC pads on the wafer to the tips of the probes on the probe card. After the wafer is in alignment for a test, the prober very precisely raises the wafer to push the probe contact points against aluminum, solder or other metal pad materials on the integrated circuits. The probes are typically individual springs, so the higher that the wafer is raised in contact with the probes, the greater is the force of the probes on the IC pads. The prober must raise the wafer high enough to create sufficient force to break through any oxides on the integrated circuit's metal pads and make a reliable contact but not raise the wafer so high that probe tips slide off the pads or that the probe tip force causes damage to the circuits under or near the IC pads. The probe card must compensate for mechanical tolerances in the manufacturing of the IC wafer, the probe contact points, the probe card electrical interconnect (printed circuit boards, ceramic substrates, flex circuits), and the prober. The probe card must also be designed to compensate for any mechanical movement due to heating of the wafer from the power generated by integrated circuits or by the prober performing high temperature testing as a reliability screen. The flexing or bending of the probe card under the force applied by the prober during testing must be limited, otherwise the probe tips will not stay in electrical contact with the IC pads. The probe card must maintain low contact resistance, consistent probe force and alignment during its operating life. Some probe card's applications can require a contact life of over a million test cycles.

A probe card analyzer is a metrology tool to ensure the quality of probe cards. Probe card analyzers can be used by probe card suppliers to verify that the probe card design is correct and that the newly manufactured probe card meets all of its electrical and mechanical specifications. Each IC design has a unique probe card that must be verified. IC manufacturers that buy probe cards may also use a probe card analyzer to verify the incoming quality of newly purchased probe cards, as well as for validating the functionality of the probe cards during the useful life of the prove cards.

Probe card analyzers need to test the electrical and mechanical properties of probe cards as well as the electrical properties of the components (e.g., relays, capacitors, and resistors) mounted on the probe card. Analyzers must check the electrical connections for resistance and leakage to each probe. Mechanically, the analyzer must determine whether the probe tip alignment and planarity meet the placement accuracy needed to make contact to all of the electrical pads on the IC wafer to be tested.

Due to the high throughput nature of semiconductor manufacturing, probe cards make thousands of test contacts a day and can make millions of test contacts over their lifetime. Over time, the repeated wafer testing can cause the probe tips to become misaligned, damaged or to pick up debris. This can result in incorrect test results and increased manufacturing costs. Probe card analyzers can be used to confirm that the probe card remains within specification throughout the life of the probe card. If the probe card drifts out of specification, the probe card analyzer provides data on what needs to be repaired and verifies that the repair process returns the probe card to its original design specifications.

The semiconductor industry's growth has been driven by delivering smaller, more complex ICs, which requires the number of interconnect pads on each IC to increase while the size of each pad shrinks. Also, to reduce the cost of wafer testing IC manufacturers are testing a larger number of ICs at the same time. This higher parallelism improves the IC tester utilization and reduces the total wafer test time and thus reduces the overall cost of tests. A few years ago, high pin count probe cards had 1,500 to 3,000 pins. The industry has introduced probe cards that can contact all of the ICs on a 300 mm wafer. These types of single touchdown memory probe cards can have up to 60,000 pins. These high pin count probe cards can require 2-5 grams of force for each probe to make contact during testing. This means that the probe card can exert a force of up to 300 Kg on the prober causing both the prober and the probe card to deflect and change the position of where the probes contact the IC pads. Traditional analysis systems for integrated circuit probe cards evolved from testing needle probe cards where there was a requirement to stop IC testing when yields dropped to analyze and adjust the needle's position and then go back to IC testing. Today, most advanced probe cards do not allow individual probe adjustments. So, the earlier test/adjust/test capabilities are no longer applicable for these applications.

FIG. 1 is a drawing representing a conventional probe card analyzer 10. Analyzer 10 includes a mechanical handler 15 that provides x, y, and z movement and holds probe card 20 with probes 25 that extend down from the probe card. Handler 15 has a top stage 50 that holds the check plates for electrical measurements, force measurement tools and a camera for measuring the optical planarity of probe tips. The check plate is connected to the measurement electronics through connector 30. The probe card 20 is connected to measurement electronics 60 through a cable 40, which is typically 1 to 3 meters long. A computer 65 communicates with a handler control 17 that communicates and operates x, y, z handler 15 through a cable 16. Computer 65 also communicates with measuring electronics 60 and synchronizes movements of handler 15 with measurements by measurement electronics 60. U.S. Pat. No. 4,918,374, entitled "Method and Apparatus for Inspecting Integrated Circuit Probe Cards," describes a known apparatus and method for testing probe cards. Even though these conventional probe card analyzers attempt to replicate the same tester force loading conditions as seen in an IC test manufacturing environment, the mechanical handlers (e.g., handler 15) used for probe card analyzers generally do not deflect the same as the production wafer probers. U.S. Pat. No. 7,170,307, entitled "System and Method of Mitigating Effects of Component Deflection in Probe Card Analyzer," describes an example of how probe card analyzers are attempting to increase their accuracy by placing a load on the probe card to minimize the effects of deflection while making probe card measurements.

SUMMARY OF INVENTION

One embodiment of the invention is a system for analyzing properties of a probe card. The system includes a wafer prober, switch electronics, a measurement unit, and a fixture. A probe card to be analyzed is placed into the wafer prober and electrically connected to the switch electronics. The measurement unit is electrically connected to the switch electronics, so that the measurement unit through the switch electronics is able to perform measurements of a probe that the switch electronics selects from among a plurality of probes on the probe card. The fixture is on a wafer stage in the wafer prober and brought into contact with the probe card so that the fixture completes a circuit that the measurement unit uses.

Another embodiment of the invention is a method for analyzing properties of a probe card. The method includes: mounting the probe card in a wafer prober of a type that uses the probe card for probing of a wafer; mounting a fixture on a wafer stage in the wafer prober; using the wafer prober to bring the fixture into contact with probes on the probe card; electrically connecting switch electronics to the probe card, wherein the switch electronics is able to select a probe from among the probes on the probe card; and measuring electrical resistance on the selected probe through the probe card to the surface of the fixture contacting the probe.

BRIEF DESCRIPTION OF THE DRAWINGS

The use of the identical reference number in the various diagrams designates similar or identical elements.

DESCRIPTION

Figure 1:
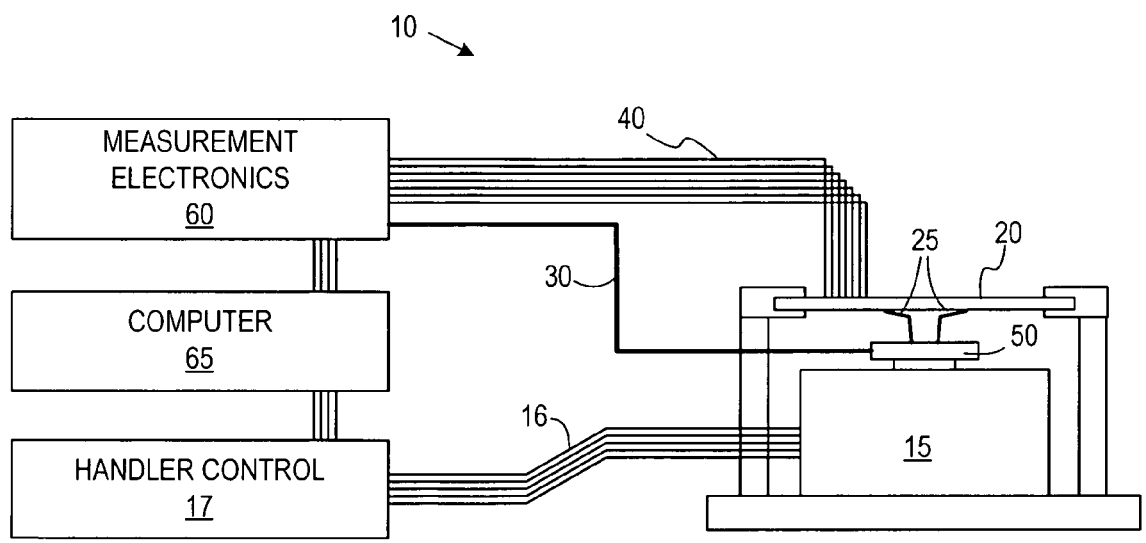
FIG. 1 is a block diagram of a conventional probe card analyzer.

The document describes architectures for probe card analyzers and systems and methods for testing, verifying, and characterizing advanced wafer level probe cards quickly and efficiently using commercially available manufacturing probers. In accordance with an aspect of the invention, very economical, compact, and advanced electrical analyzer electronics can mount onto a probe card while the probe card is installed in a prober. This electronics can be controlled by an off-the-shelf computer controller and interfaced to a measurement system containing one or more commercial meters for resistance and leakage measurements using only a small number of cables. A method is described for using metalized wafers and isolation probes with the analyzer to support electrical, physical and mechanical parameters required for probe card measurements. Some of these wafers are also used to imprint probe scrub marks that can be analyzed visually for positional accuracy, scrub length and probe mark depth. Measurements can be performed at all operating temperatures and all force loads that a prober subjects the probe cards to during wafer probing, which improves probe card measurement accuracy and utility. Software analyzing the results of the measurements can be used to monitor and improve the functionality and reliability of the probe cards, which would improve IC yields and reliability. This method of analyzing probe marks can provide both a more accurate process and a faster process than the existing measurement processes of individually measuring probe force and probe tip positions.

In one embodiment of the invention, probe card analyzer electronics are connected directly onto the target probe card to be measured. This target probe card can be mounted in a commercial wafer prober in the same manner as the probe card would be mounted for high volume IC wafer testing. Instead of attempting to replicate the probing environment to measure the specifications of a probe card, this invention enables using the real manufacturing prober environment that can enable operating temperature ranges such as −55° C. to +200° C. while performing the electrical measurements on the probe card. Any flexing of the tester system caused by either the connector forces that interface to the tester, forces of the probes on the probe card making contact to the wafer being tested, or movement of the tester PCB due to thermal expansion can be measured using this architecture on a real prober.

Another embodiment of the probe card analyzer uses different fixtures for supporting measurements. One type of fixture uses silicon wafers with a continuous conductive film on the top surface (e.g., a conductive blank wafer) or patterned wafers or plates with conductive interconnect paths that can be used by the commercial prober to accelerate and improve the accuracy of the measurements of the probe card. A conductive blank wafer with a wear resistant material can be loaded by the prober onto the prober chuck and held in place using a vacuum. This conductive blank wafer is used to support testing the electrical resistance and planarity of all of the probes that are routed to tester signals. A follow on wafer with a conductive film of the same material as the target IC pad metal can then be loaded and brought into contact with the probe card by the prober to obtain, in addition to contact resistance, probe scrub marks for optical analysis of the locations, lengths, widths, scrub directions, and depths of the probe scrub marks. One or more custom patterned wafers or plates with wear resistant metal pads can then be loaded to isolate and test the power, ground, and any shared signal probes that are bussed together on the probe card. The patterned wafer can thus enable independent measurements of the resistance and planarity of probes that are electrically connected together in the probe card. This patterned wafer or plate may be patterned to have individual pads (isolation dots or pads), and each power or ground probe can be stepped onto an isolation dot using the prober. This method of measurement also ensures that each power or ground probe is properly connected to the right power or ground nets.

Yet another embodiment of the invention replaces the patterned wafers (isolation wafers) or plates (isolation plates) with a custom probe card (isolation probe card) which has a set of individual probes that can contact each of the bussed or shorted probes on one or several die sites of the probe card. Effectively this card isolates each bussed probe so that the resistance and electrical planarity of the bussed probe being tested can be independently measured. The isolation probe card can be built using a conventional tungsten needle card or other conventional probe card technologies. This isolation probe card can mount on the prober wafer chuck or an attachment to the wafer chuck and be driven by the prober stage to the proper location for measuring resistance and electrical planarity.

Another embodiment of the invention mounts a single diagnostic probe on the prober wafer chuck or attachment to the wafer chuck as an electrical diagnostic tool. The location of the diagnostic probe tip can be controlled by the prober stage to enable electrically testing of various connections on the probe card being analyzed. These connections could include probe tips, interconnect on the space transformer and components mounted on the probe side of the probe card. The probe card analyzer electronics can provide a voltage level or stimulus to the probe card being analyzed so that the diagnostic probe can determine if the appropriate signal stream or voltage level is reaching the connection point. The diagnostic probe can also be used to apply voltages and control logic signals to the probe cards. This diagnostic probe can also perform the function of a force measurement gauge. The spring constant and force of the diagnostic probe can be measured as a function of displacement. By using the prober stage to push the diagnostic probe against each individual probe on the probe card under test, the force versus displacement of each of the probes under test can be calculated.

Yet another specific embodiment of the invention uses low leakage and low resistance solid state switches in a design configured to be insensitive to the switch and measurement path resistances when performing probe resistance measurements with a commercial 4 terminal source meter. These switches can be mounted on pin electronics cards that interface through IC tester connectors directly to a probe card while the probe card is mounted on a prober. A combination of jumper wires, control circuitry, daughter cards and software enables the analyzer to measure passive components on the probe card and work with IC switches or DFT (Design For Test) ICs mounted by the probe card manufacturer. There can be over 200 pin electronics cards with each having the potential for unique configurations from jumpers, controls and daughter card connections. A pin card with the wrong configuration or connected to the wrong connector on the probe card being analyzed could result in incorrect measurements or damaging the probe card. This embodiment can use a configuration method to uniquely identify pin and daughter card configurations before starting probe card testing. To make sure that the inventory of different pin boards is manageable both during manufacturing and in use, each pin board is designed to be configurable and interchangeable.

Another aspect of the invention is the use of software to analyze electrical anomalies captured by the electronic measurements for each probe's position at each stage location, and then to drive microscope stages to look at probe tips and/or probe marks to determine if there is a visible physical/mechanical cause for the errant electrical reading. Analysis of the depth and shape of the probe mark can be correlated to improving the lifetime of the probe card and the yield of the ICs being tested.

Another embodiment of the invention uses a probe card analyzer to capture rapid measurements for lifetime testing of probe cards at operating temperatures to determine how debris or wear on probe tips affects the lifetime and reliability of new probe technologies. This embodiment can also be used to isolate intermittent electrical connections in the probe card.

Another embodiment of the invention uses a bit serial signaling scheme to communicate to control logic on each of the pin cards containing the switches. The invention also uses a daisy chain scheme to connect the 4 measurement rails of the measurement unit to each of the pin cards. This drastically reduces the number of cables needed between the test head that contains all the switches to the controlling computer and measurement unit thereby drastically reducing cost, complexity, bulk as well as improving system reliability and accuracy. The bit serial signaling scheme can utilize hardware signaling conventions such as RS485 which allows just a few wires to be connected between all the pin cards and the controlling computer. Software messaging on these wires can utilize conventions such as a packetized protocol that would allow the controlling computer to independently address and communicate with each of the pin cards connected to these wires. The data packets in the protocol can contain distinct commands, address to select a specific pin card, address to select a specific switch or group of switches on the selected pin card, and data specific to the controlling of the selected switches. This scheme which allows direct manipulation of selected switches coupled with commands that allow all the switches to be set, cleared or preset to certain patterns enables each test configuration to be communicated to all the pin cards in a minimum of data bytes transferred on the said wires, thereby enabling fast setup times for each test.

Another embodiment of the invention utilizes two registers in the control logic to control the switches. Since the switches are partitioned across a number of pin cards, these registers are also partitioned accordingly. The first register is the output register where each of the bits in the register controls the state of one or more corresponding switch or switches. This output register can be loaded in parallel simultaneously from the second register called the shift register. This shift register can be loaded by the control logic either in bit serial fashion or by direct addressing as described previously. This scheme of double register allows the output register to hold the switches in one pattern for a test while the shift register is being configured for the next test. This architecture effectively hides the time needed for configuring the switches for each test since it is carried out in parallel with the measurement cycle of the previous test. To further increase the overall test throughput, the handshaking between the measurement unit and the control logic to advance the patterns can be performed in hardware instead of using software polling or software interrupts.

To be accurate, a probe card analyzer needs to replicate as closely as possible the tester loading conditions as seen when probing a wafer in a manufacturing environment, particularly when the analyzer measures electrical parameters and physical locations of the probes. Probe card analysis systems can measure probe heights electrically and/or optically and probe tip alignment optically. Many probes can be intentionally shorted (bussed) together on probe cards. For example, power, ground and address lines typically have probes with similar functions connected together. To electrically measure each individual probe, the probe must be isolated from every other probe to which it is shorted (bussed together). The measurement of shorted probes can be performed using check plates that are provided as part of the probe card analyzer system. Check plates can consist of multiple parallel strips or individual dots of conductive metal that are electrically isolated from each other. By having one of the shorted probes make electrical contact to a dot or strip, the probe can have its resistance measured independently from the other probes to which the probe is shorted. Probe card analyzers can use a force measurement tool that allows the analyzer to individually isolate each probe and measure the force on the probe with increases in deflection. The force measurement can be used to verify that there is sufficient force to make a reliable electrical contact but not so much force that the probe will damage an IC being tested.

Electrical verification testing of a probe card may entail measuring the contact resistance of each probe, the isolation leakage current of each channel to the other channels on the probe card, the planarity of the probe tips in conjunction with the force applied by each probe to a Device Under Test (DUT). Verification testing of a probe card may also measure the physical location of each probe together with the scrub distance of each probe at the compression required to make a reliable electrical contact of all of the probes to the target IC pads. In accordance with an aspect of the invention, a method enables the individual tests for verification of a probe card to be completed in less time than traditional analyzers. In addition, the accuracies of the measurements are improved by using the environment of a probe card installed onto any target commercial prober for the measurements, rather than the current analyzer implementation which consists of designing a single frame which acts as a surrogate for all different types of commercial probers.

Successful contact resistance testing requires that all the probes be brought into reliable contact with a DUT wafer and the resistance between the tester terminal on the probe card and the DUT wafer be measured accurately at the intended test temperature of the DUT wafer. One aspect of this invention provides a high speed 4-wire measurement of this resistance using a solid state switching matrix to connect to a source meter.

Figure 2A:
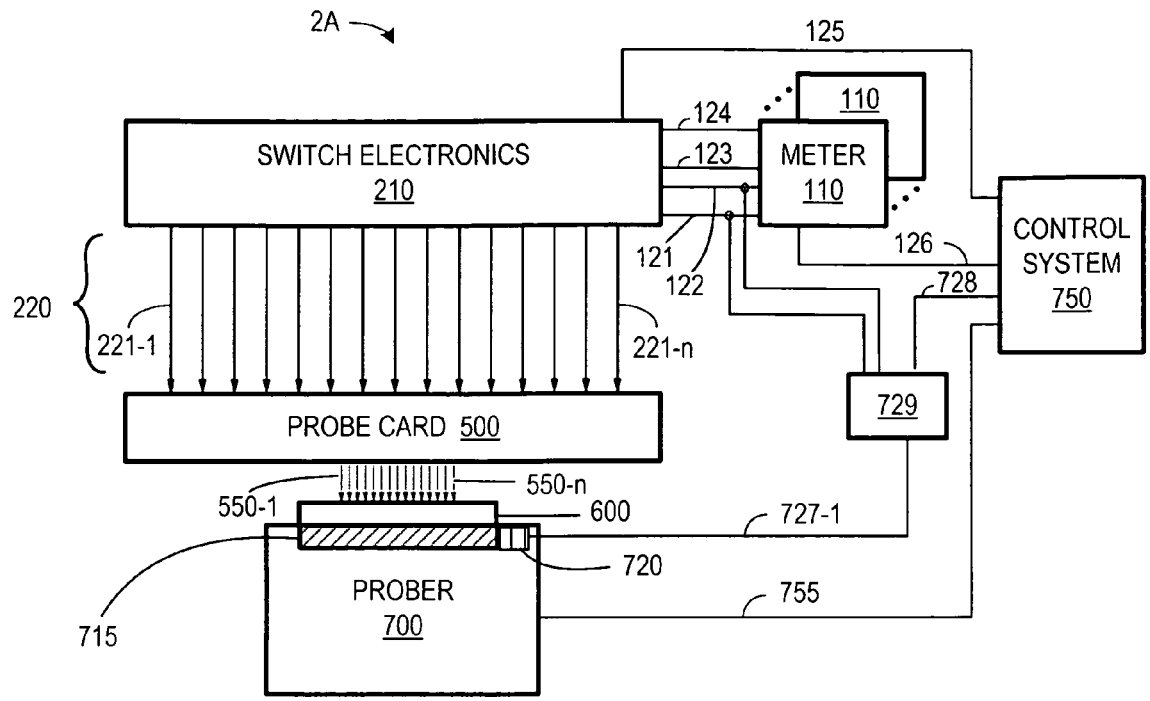
FIG. 2A is a block diagram showing analyzer electronics and mechanical components of a probe card analyzer in accordance with an embodiment of the invention.

FIG. 2A shows a block diagram of a probe card analysis system 2A testing a probe card 500. System 2A includes a wafer prober 700, a fixture 600 that is mounted on prober 700, switch electronics 210, one or more source meters 110, and a controller 750.

Wafer prober 700 is preferably a commercial wafer prober so that probe card 500 can be mounted onto wafer prober 700 using the same mounting method that would be used when probe card 500 is used to test IC wafers in a manufacturing environment. Measurements of probe card 500 can thus more accurately represent probe card 500 during wafer probing. For probe card analysis, wafer prober 700 holds fixture 600, and automatic test equipment (ATE) that would be connected to probe card 500 is replaced by switch electronics 210, meters 110, and associated circuitry.

Each source meter 110 performs electrical measurements of probe card 500. Meters 110 are connected through switch matrix 210 to probe card 500. For example, in the illustrated embodiment, each meter 110 is a 4-wire resistance meter having four terminals 121, 122, 123, and 124 corresponding to Force+ or F+, Sense+ or S+, Sense− or S−, and Force− or F−, and switch electronics 210 can switch each or all of terminals 121, 122, 123, and 124 to any of the tester channel terminals 221-1 to 221-*n* connected to probe card 500. In one specific embodiment, each meter 110 is a Digital Multi Meter (DMM) switch system 2750, series 2400 or series 2600 made by Keithley Instruments. However, other types of meters can be used, and the wires between meters 110 and the switch matrix 210 can be expanded to allow switching amongst several different types of meters 110 that could be used to analyze probe card 500. This document generally refers to meters 110 as being a single 4-wire measurement system for simplicity and to provide a concrete example, but it should be understood that multiple meters of one or more types could be employed to increase the speed or capabilities of the probe card analysis.

Figure 3:
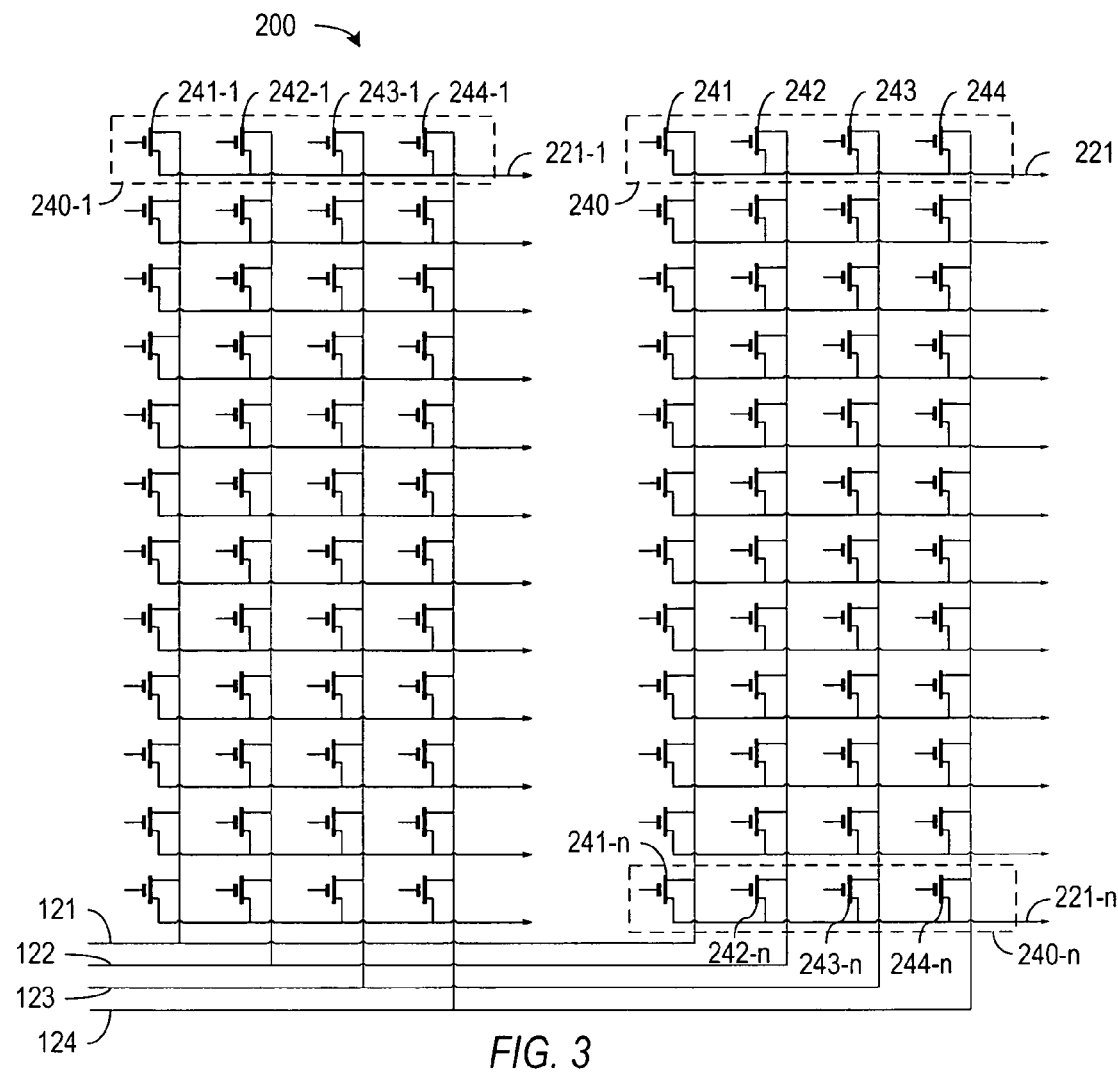
FIG. 3 shows a switch matrix which may be used on the pin cards in a probe card analyzer in accordance with an embodiment of the invention.
Figure 4A:
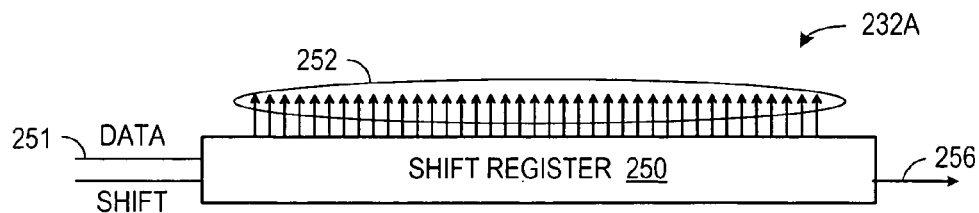
FIGS. 4A and 4B show block diagrams of alternative embodiments of the invention using a control register without and with an intervening register to allow simultaneous test and shift.
Figure 4B:
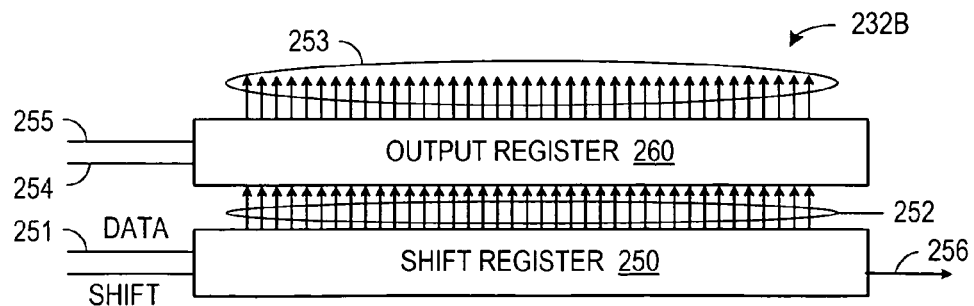

FIG. 3 shows an embodiment of a switch array 200 that includes multiplexers or demultiplexers 240-1 to 240-*n* respectively corresponding to tester channel terminals 221-1 to 221-n of switch electronics 210 of FIG. 2A. In switch array 200, each multiplexer 240-1 to 240-n (generically referred to herein as multiplexers 240) contains switches used to select which meter terminals or rails are connected to each tester channel 221-1 to 221-n. For example, multiplexer 240-1 contains switches 241-1, 242-1, 243-1, and 244-1 connected between tester channel terminal 221-1 and respective meter terminals 121, 122, 123, and 124, and multiplexer 240-n contains switches 241-n, 242-n, 243-n, and 244-n connected between tester channel terminal 221-n and respective meter terminals 121, 122, 123, and 124. Switch array 200 and associated control electronics 232A or 232B as shown in FIGS. 4A and 4B can be mounted on one or more Printed Circuit Boards (PCBs). Typically, the number of PCBs is chosen to match the number of ATE connectors on the target probe card while the number of test channels corresponding to the switches and control logic on each PCB is chosen to accommodate the maximum number of test channels needed per ATE connector. It is desirable to have an architecture that would accommodate all the different ATE tester's probe card connector configurations. This means that the command structure of the control logic must support the maximum number of PCB's needed as well as the maximum number of test channels needed per PCB. However, using too high of an upper bound would unnecessarily increase the size of the command's address fields leading to larger command packets causing a decrease in test configuration speed, which can lead to increase in test time. The preferred upper bound is 256 PCBs and 512 test channels per PCB.

FIG. 3 shows one set of measurement rails 121, 122, 123, and 124 connected to one measurement meter. This allows any test channel to access any rail of the meter regardless of the PCB that contains the test channel. This supports a single measurement to be carried out at a time. This architecture can be extended to multiple measurements at a time to increase test throughput. This can be achieved by providing multiple sets of measurement rails to the PCBs where each measurement rail set is connected to a different measurement meter. As noted above, multiple meters 110 or different types of measurement units could be used to speed up the measurement process or provide different test capabilities. In general, each measurement unit can be shared amongst many PCBs, and the specific circuitry for switch array 200 can be varied according to the types and numbers of measurement units or meters 110 used. The measurement units can reside outside of each PCB and can be either designed specifically for the Probe Card Analyzer (PCA) or be a commercially available unit.

One or multiple PCBs together are parts of switch electronics 210 of FIG. 2A and are connected to probe card 500 by a connector system 220 that is similar to or in some cases identical to the system used for connecting probe card 500 to an automatic test equipment (ATE) tester when probe card 500 is being used for IC wafer testing. Therefore, probe card 500 in analyzer 2A of FIG. 2A can experience the same mechanical and electrical constraints that functioning probe cards experience during live wafer testing.

Controller 750, which may potentially be a personal computer PC with appropriate interfaces and software, is connected to switch electronics 210, one or more source meters 110, and prober 700. Controller 750 controls and monitors the movement of prober 700, measurement units 110, the sequencing of the switches in switch electronics 210, any embedded electronics on probe card 500, and any optical systems.

Probe card analyzer 2A optionally includes a diagnostic probe 720 which can be attached to a chuck 715 in prober 700. Diagnostic probe 720 can be connected to the rest of probe card analyzer 2A through a cable 728, a connector 727-1, and potentially a set of switch electronics 729, to support measurements using source meter terminals 121 and 122, e.g., F+ and S+.

Figure 2B:
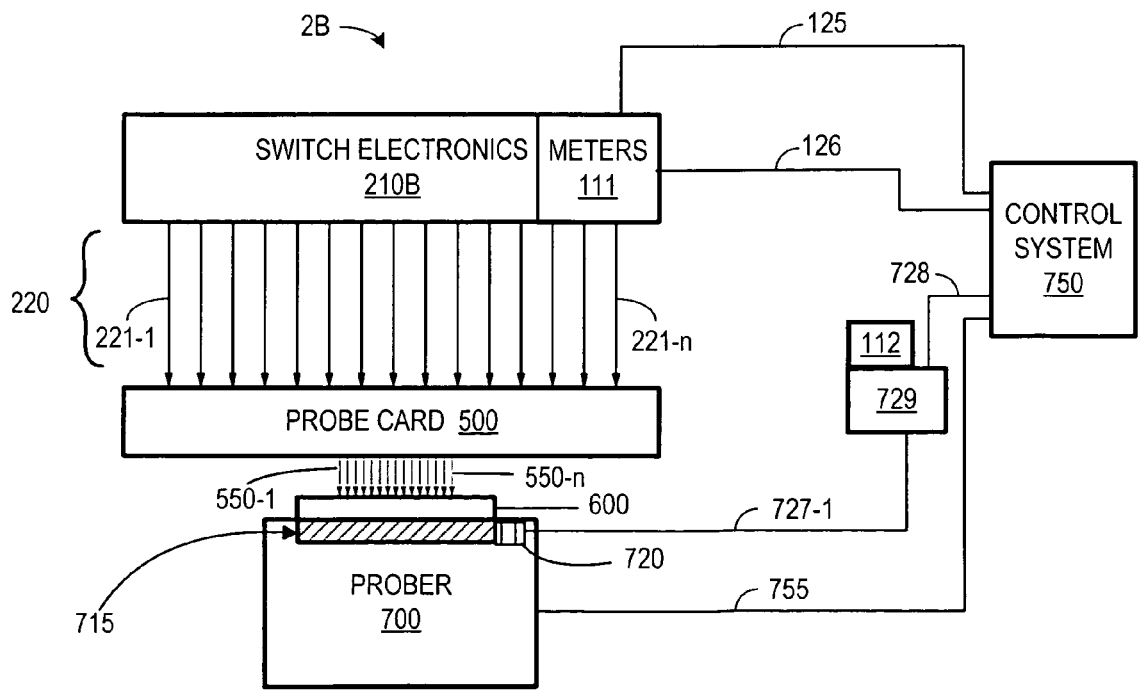
FIG. 2B is a block diagram showing a probe card analyzer in accordance with an embodiment of the invention having measurement units on each pin card.

FIG. 2B illustrates a probe card analyzer 2B that is similar to probe card analyzer 2A of FIG. 2A, but probe card analyzer 2B has source meters 111 inside of the switch electronics 210B. For this embodiment, an independent source meter 112 can also be mounted on the diagnostic probe switch card 729 connected to probe 720.

Traditional probe card analysis systems use mechanical relays for the switches typically because of their low "on" resistance and low leakage. These relays are bulky and expensive. Moreover, they are unreliable, and the contact resistance internal to the relay varies over time and impacts the resolution needed for resistance tests. The relays tend to wear out after about a million cycles and need to be replaced. Therefore, traditional analyzers have not been able to measure contact resistances accurately, especially over time as the mechanical switches wear. An alternative is a CMOS or FET solid state switch which provides long term reliability and stability. But, the "off" state leakage current of these switches are typically in the 1 microamp range. So, for switching one line to many thousands of lines would require a tree structure of switches to keep the leakage current of the "off" switches to within a manageable level. This tree structure adds resistance to the measurement path from the series resistance of the switches in each level of the tree. The tree approach also increases the total number of switches needed. The "on" resistance of these switches is typically in the 1-10 ohm range. This makes them unsuitable for measuring the contact resistance which is typically well less than an ohm for some channels. Field effect transistors (FETs) can be used for switches 241-1 to 241-n, 242-1 to 242-n, 243-1 to 243-n, and 244-1 to 244-n in switch array 200 of FIG. 3, which when built using silicon on sapphire or other silicon on insulator technology can yield switches with leakage current in the 0.01 to 0.1 nA range. This very low leakage enables switch matrix 200 to be as short as one level. Since the solid state switches are a lot more compact than traditional reed relays, switch matrix 200 has the physical space necessary to allow multiple switches to each test channel. The use of a 4-wire measurement unit along with low leakage FET switches results in a system that can quickly and accurately measures the contact resistance of the individual probes without the variations caused by mechanical relays.

Mechanical relay switches also require longer settling time than FET switches. This settling time slows down test times when compared to solid state FET switches. Relay switches also require relatively higher switch currents, forcing the control electronics to be more complex in order to handle the high current and the high temperature caused by the higher current. The FET switch, however, requires very little or no switching current in comparison to relays. The lower switching current allows the control lines to be driven by smaller output transistors on a CMOS circuit. This lower current also enables the control electronics to be completely contained in one or more programmable CMOS gate arrays and reduces the size of the PCBs, cables and power supplies thus making the system simple, economical and small.

FIG. 3 shows the schematic of switch array 200 for the case of using 4-wire measurement as the source meter, each set of four switches 241, 242, 243, and 244 are configured as 4:1 multiplexers 240 such that test channels 221-1 to 221-n that connect to probe points on the probe card can be connected to any of the 4 measurement terminals 121, 122, 123, 124 of a source meter, e.g., meter 110 in FIG. 2A.

FIG. 4A shows control logic 232A that contains a shift register 250 having a scan data input port 251, output bits 252, and a scan data output port 256. Output bits 252 are connected to the gates of a set of switches 241-1 to 241-$n$, 242-1 to 242-$n$, 243-1 to 243-$n$, or 244-1 to 244-$n$ in switch array 200. Accordingly, state data stored in a section of register 250 of 4$n$ bits long can control multiplexers 240-1 to 240-$n$ in switch array 200 of FIG. 3. Loading in the desired state of each of the switches by shifting in data through scan data input port 251 of shift register 250 can greatly reduce the number of wires needed to control switch matrix 200 and to provide connections to a probe card being analyzed. In fact, in an embodiment where switch array 200 is implemented on multiple printed circuit cards, shift register 250 can similarly be the a set of shift registers that are on the circuit cards and chained together so that scan-output 256 from one shift register feeds the scan input 251 of the next shift register in the chain, e.g., in the next card. The interface to the controlling PC controlling switch matrix 200 can be reduced to less than ten wires 125. This reduces the cost and complexity of the analyzer system compared to analyzer system 10 of FIG. 1, which may use the thousands of wires and connectors 40 needed in traditional probe card analyzers of FIG. 1 to connect measurement electronics to a probe card being analyzed.

For a 4-wire measurement of the contact resistance of each probe on the probe card, one embodiment contacts a blank metalized wafer so that all the probes on the probe card are shorted together thus allowing the contact resistance of the selected probe to be measured by connecting one of the force (e.g., F+) and one of the sense (e.g., S+) rails from the measurement unit to the selected probe while the other force and sense rails (e.g. F− and S−) are connected to one or more other probes on the probe card. Similarly, leakage resistance of a selected probe can be measured by leaving the probes not in contact with the blank wafer thus isolating the probes from one another. The selected probe is then connected to one pair of force and sense rails F+ and S+ while the other force and sense rails S− and F− are connected to all the other probes. With these measurement processes, it is possible to control the four switches of each test channel with only three bits in the controlling output register since both rails F+ and S+ are always connected to or disconnected from a test terminal at the same time. An alternative embodiment of the control logic uses a shift register that is three bits wide with random write capability to any 3-bit location in the shift register. This approach allows much faster loading than a serial shift of all of the bits every time the shift register needs to be loaded, but still requires a relatively small number wires for the control interface. An implementation of this architecture to support current ATE testers can support up to 512 test channels 221 per pin card, but the architecture is capable of scaling to higher channels counts as future ATE testers increase their channel counts.

FIG. 4B shows an alternative control circuit 232B that has an output register 260 between shift register 250 and the switches in switch matrix 200. In particular, output bits 252 of shift register 250 are connected to a data input port of output register 260, and output bits 253 of output register 260 are connected to multiplexers 240 in switch matrix 200. A control load line 255 enables the transfer of the data in register 250 to output register 260. This allows out put bits 253 that go to the gates of the transistor switches to be held stable for one test while the data for the next test can be shifted into shift register 250 at the same time. This can help to reduce test time. A clear reset line 254 also is provided to register 260.

Figure 5A:
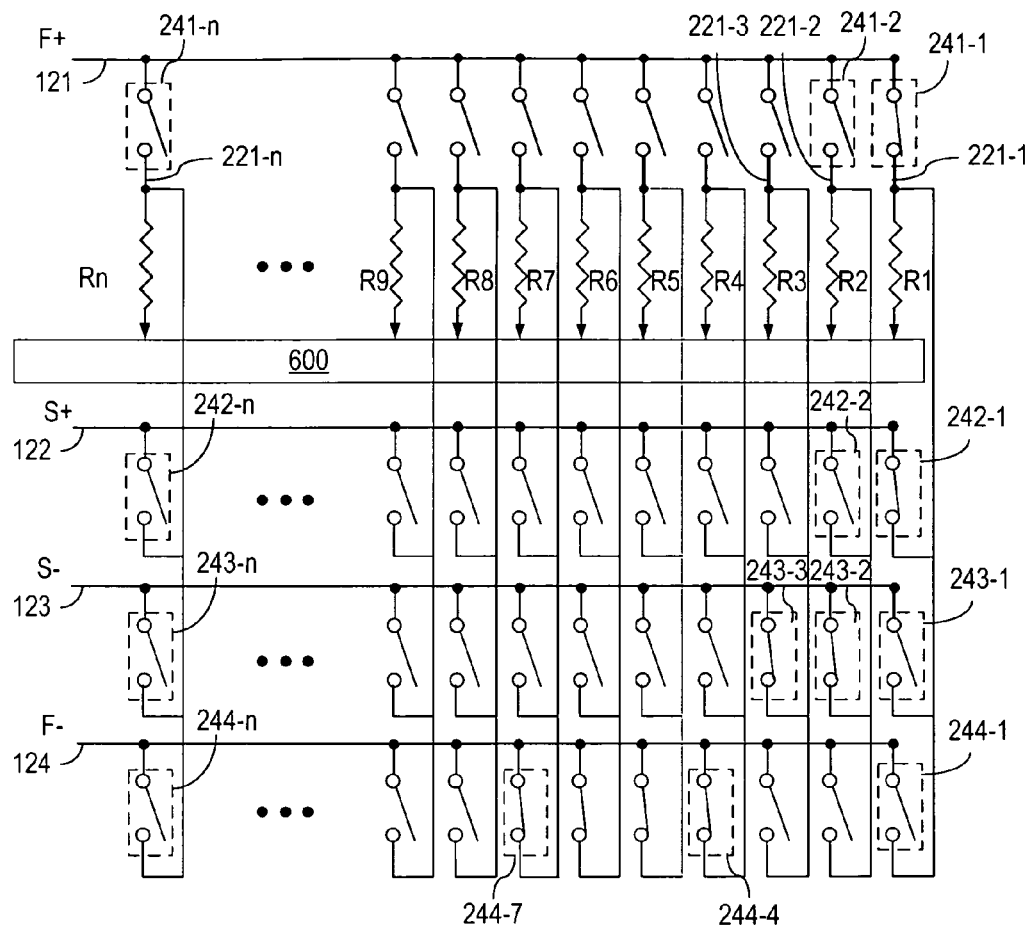
FIG. 5A is a schematic showing a switch configuration for a contact resistance measurement in accordance with an embodiment of the invention.

FIG. 5A shows an equivalent schematic of a probe card analyzer such as shown in FIG. 2A or 2B during a 4-wire contact resistance test when the probe card is in contact with a fixture 600. In FIG. 5A, resistors R1 to Rn represent the resistances of the probe card through probe points nominally making contact with fixture 600. For probe resistance measurements, fixture 600 is a shorting fixture and can be a blank aluminum coated wafer, a blank gold coated wafer, a hard durable material like a tungsten coated wafer, a patterned wafer or any other fixture that would short many probe points together.

FIG. 5A shows one potential configuration of switches 241-1 to 241-$n$, 242-1 to 242-$n$, 243-1 to 243-$n$, and 244-1 to 244-$n$ in switch electronics 200 for a measurement of a resistance R1 of a probe corresponding to test channel 221-1. For this test, switches 241-1 and 242-1 connect test channel 221-1 to respective source terminal 121 (F+) and sense terminal 122 (S+). Switches 241-2 to 241-$n$ and 242-2 to 242-$n$ are open, so that meter terminals 121 and 122 are not connected to any other test channels 221-2 to 221-$n$. When using a blank conductive wafer as fixture 600, fixture 600 shorts all the probes of the probe card together, and one or more arbitrary test channels can be connected to sense terminal 123 (S−) and source terminal 124 (F−). In FIG. 5A, two channels 221-2 and 221-3 are connected through switches 243-2 and 243-3 to the S− rail 123 and are in contact with fixture 600 via the probes with resistances R2 and R3. This completes the sense circuit between the S+ and S− rails. Since there is virtually no current flowing in the sense circuit, resistance R2 and R3 do not significantly affect the measurement result. Four switches 244-4 to 244-7 are used to connect the F− rail 124 to respective test channels 221-4 to 221-7 which contact fixture 600 through resistances R4 to R7. This completes the source current path between the F+ and F− rails 121 and 124. Since the sense circuit is measuring the voltage drop across only the resistance R1 of target channel 221-1, resistances R4-R7 will not affect the measurement result. It is preferable to use more than one test channel for connection of the measurement rails S− and F− rails so that if one of these test channels is defective or open, the other channels will still complete the circuit to complete the test with no significant effect on the measurement result. For S− sense rail 123, it is preferable to select test channels that have probes located physically close to the target channel's probe so that the resistance of path between R2 or R3 to R1 on fixture 600 is negligible. In practice, two to three S− channels may be needed, and five to ten F− channels are preferred. Also, power and ground channels are preferred for F− since power and ground channels typically have lower resistance, for example, because multiple probe pins may be connected in parallel for power and ground and the connection within the probe card PCB has lower resistance.

During a resistance test, source meter 110 applies a fixed current through the probe card and fixture between F+ terminal 121 and F− terminal 124. The voltage across the target resistance measured across the S+ 122 and S− 123 rails yields the measured resistance. It is preferred that the voltage across F+ terminal 121 and F− terminal 124 be limited to a low value such as 10 mV to 100 mV. Higher voltages may not detect any marginally resistive interfaces in the system or at the probe contact point. This interface resistance is a condition caused by a thin barrier layer of insulating material between contact surfaces. Applying high voltages could break this barrier during the test time and fail to detect the potentially intermittent, unreliable contacts. If the F+ to F− voltage is allowed to rise higher than 100-200 mV as the current source tries to push the voltage to achieve the target current, the current can burn through the interface barrier and produces a temporally low resistance measurement instead of the actual interface resistance reading. Analyzer software, which resides in controller 750 of FIG. 2A, can control the voltage levels to prevent this burn-through or punch-through condition during resistance measurements.

A contact resistance test process using probe card analyzer 2A of FIG. 2A can proceed as follows. 1. Have prober 700 engage fixture 600 against the probes on probe card 500 by positioning fixture 600 on the wafer chuck of prober 700 and raising fixture to make contact. 2. Scan in the switch control data into switch electronic 210. 3. Apply the prescribed source current across F+ terminal 121 and F− terminal 124 of source meter 110, while limiting the maximum voltage across terminals 121 and 124. 4. Wait until the desired current is achieved and the voltage across F+ and F− are stable. 5. Measure the voltage drop across S+ terminal 122 and S− terminal 123. 6. Turn off the source current between terminals 121 and 124. 7. Repeat steps 2 through 6 for each of the channels 221-1 to 221-*n* to the probes to be tested. For the solid state switches, since there is no mechanical contact that can cause arcing, it is possible to leave the source current on while changing the switch configuration between tests, thereby increasing test speed.

TABLE 1

Figure 5B:
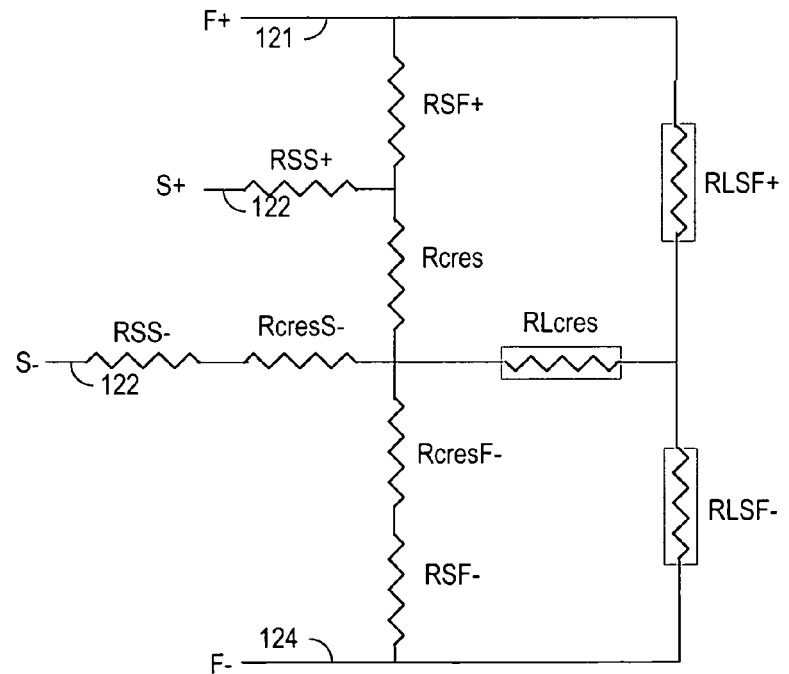
FIG. 5B is an equivalent circuit schematic of a system for contact resistance measurement in accordance with an embodiment of the invention.

Signals and Resistances in FIG. 5B

| | |
|---|---|
| RSF+ | Switch resistance of F+ path |
| RSS+ | Switch resistance of S+ path |
| Rcres | Target contact resistance for measurement |
| RLcres | Composite contact resistance of leakage path |
| RcresS− | Composite contact resistance of S− path |
| RcresF− | Composite contact resistance of F− path |
| RLSF+ | Composite switch resistance of leakage F+ path |
| RLSF− | Composite switch resistance of leakage F− path |
| RSF− | Switch resistance of F− path |
| RSS− | Switch resistance of S− path |
| F+ | Meter F+ source rail |
| F− | Meter F− source rail |
| S+ | Meter S+ sense rail |
| S− | Meter S− sense rail |

FIG. 5B shows an equivalent circuit of the switches and the contact resistances of the probes identified in Table 1 for making a contact resistance test on Rcres, when the switches are configured as shown in FIG. 5A. The resistances that can significantly affect the measurement result are a resistance RLSF+ corresponding to a composite of switch resistance and leakage in the path from the F+ measurement rail and a resistance RLcres corresponding to a composite of contact resistance in the path to the F− measurement rail. The value of resistance RLSF+ is a function of the total number of switches connected to the F+ measurement rail in parallel and the "off" state leakage resistance of the switches connected to the F+ measurement rail. When this total leakage resistance value approaches a low enough value that the total leakage resistance would affect the measured value significantly enough (e.g., 10 to 20% of the value of resistance Rcres), the number of switches connected in parallel will have to be limited, and a serial tree structure of switches can be implemented to segregate the switches into groups to lower the leakage. The use of very low leakage switches allows this tree structure to be only one high or totally flat (without a tree) due to the very high leakage resistance of the switches. One of the advantages of the low leakage FET switches is they provide as many switches connected in parallel to a measurement rail as possible without significantly increasing the leakage current from becoming a noticeable percentage of the total current driven over the F+ and F− measurement rails.

Figure 6:
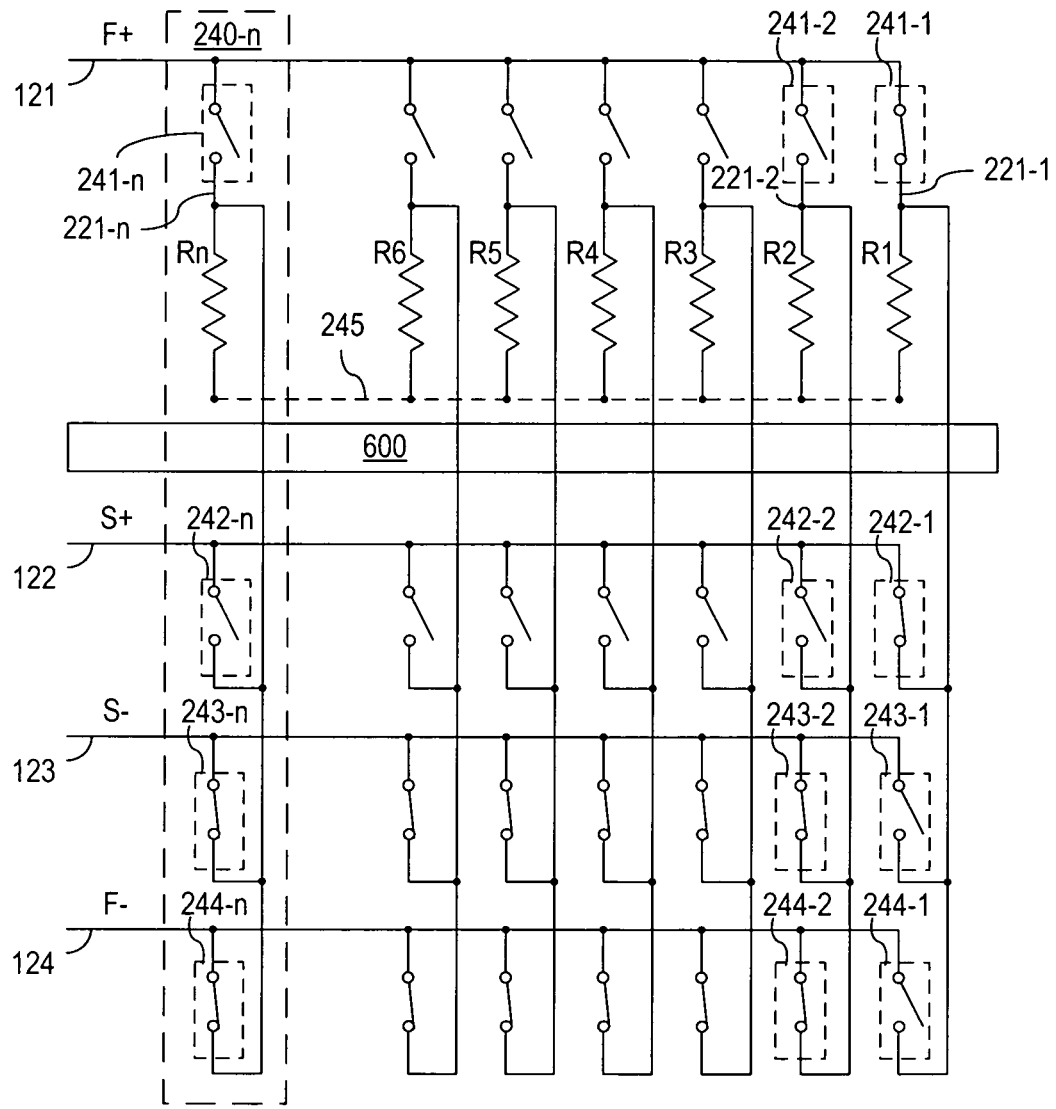
FIG. 6 is a schematic showing a switch configuration for a leakage measurement in accordance with an embodiment of the invention.

FIG. 6 shows a switch configuration schematic for measuring leakage. This test is looking for shorts or leakage between test channels on the probe card. In FIG. 6, switches 241-1 to 241-*n* are between respective test channel terminals 221-1 to 221-*n* and F+ source rail 121, and switches 242-1 to 242-*n* are between respective test channel terminals 221-1 to 221-*n* and the S+ sense rail 122. Switches 243-1 to 243-*n* are between respective test channel terminals 221-1 to 221-*n* and S− sense rail 123, and switches 244-1 to 244-*n* are between test channel terminals 221-1 to 221-*n* and the F− source rail 122. The probe card is disengaged from fixture 600 so that all the probes (and all test channel terminals 221-1 to 221-*n*) should be isolated (i.e., electrically floating). Since probes are not required to make electrical contact during the leakage test, the leakage test can be applied to a component PCB used in the manufacture of the probe card before the PCB is assembled into the probe card. A current path 245 illustrates probe card leakage path from a target channel to any other test channel. In particular, the states of the switches in FIG. 6 are set for detecting leakage from test channel terminal 221-1 to any of test channels 221-2 to 221-*n*. For this test, switches 241-1 and 242-1 connect F+ and S+ rails 121 and 122 to test channel 221-1, and switches 243-2 to 243-*n* and 244-2 to 244-*n* connect S− and F− rails 123 and 124 to test channels 221-2 to 221-*n*. Leakage tests of other test channels 221-2 to 221-*n* can be similarly conducted by connecting rails F+ and S+ rails 121 and 122 to the target channel and connecting all remaining test channels to F− and S− rails 123 and 124. This configuration can be achieved through the use of low leakage switches where connecting a very large array of switches becomes feasible.

A leakage current test sequence using the probe card analyzer of FIG. 2A or 2B can proceed as follows. 1. Ensure that fixture 600 (e.g., an aluminum wafer) is fully disengaged from the probes of the probe card. 2. Scan in the switch control data into switch electronics 210, e.g., to establish the switch states shown FIG. 6. 3. Apply the prescribed voltage across F+ source rail 121 and F− source rail 124 from the source meter while limiting the maximum current. 4. Wait until the voltage across F+ and F− rails 121 and 124 is stable. 5. Measure the current across the F+ and F− rails to determine whether the channel has unacceptable leakage. 6. Turn off the source voltage. 7. Repeat steps 2 through 6 for each of the channels to be tested.

Figure 7A:
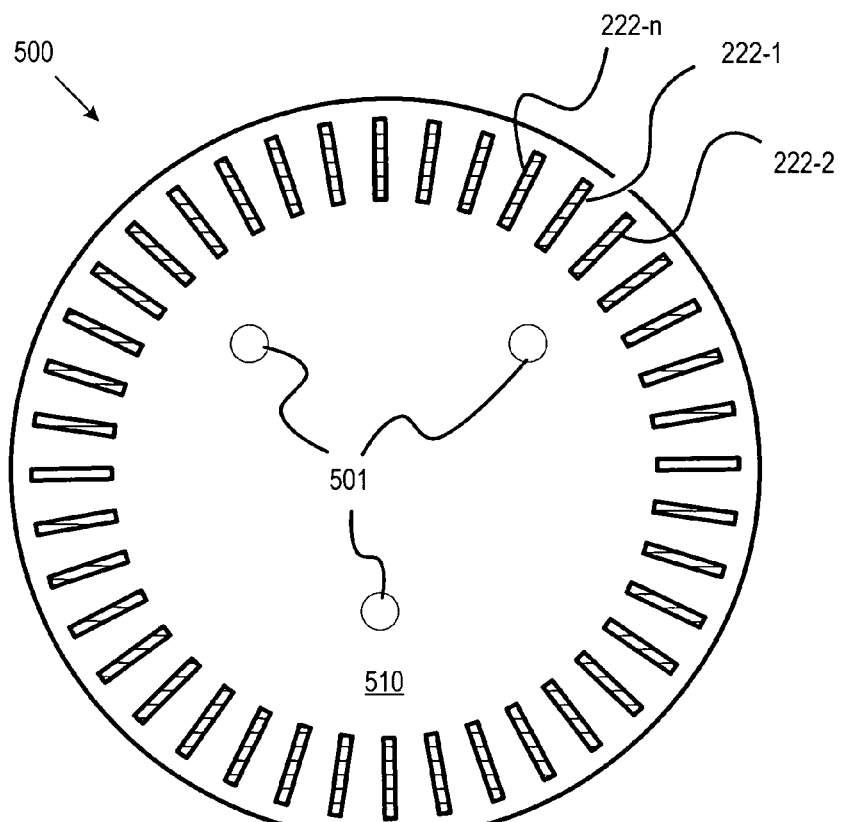
FIG. 7A shows a top view of a memory probe card in accordance with an embodiment of the invention.

FIG. 7A shows the top view of a typical layout of a memory probe card 500 with ATE connectors 222-1 to 222-*n* (generically referred to herein as ATE connectors 222) arranged around the periphery of a PCB (printed circuit board) 510. ATE connectors 222-1 to 222-*n* are used during wafer probing for making connection to an IC tester (ATE) and are connected during probe card analysis to analyzer test channel terminals, e.g., test channel terminals 221-1 to 221-*n* in switch electronics 210 of the probe card analyzer described above.

Figure 7B:
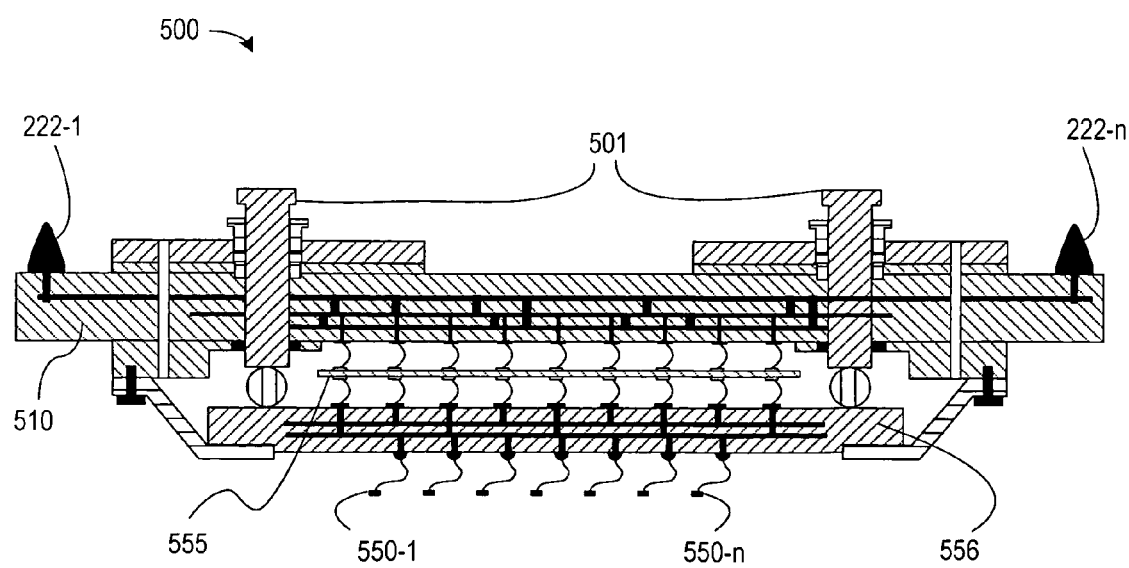
FIG. 7B shows a cross-sectional view of a memory probe card in accordance with an embodiment of the invention.

FIG. 7B shows a cross-sectional view of memory probe card 500. Probe card 500 includes probe tips 550-1 to 550-*n* on a space transform 556 that is electrically connected to respective ATE connectors 222-1 to 222-*n* through an intervening support structure 555 and conductive traces in PCB 510. Before or after measuring electrical and/or optical planarity of probe tips 550-1 to 550-*n* using a probe card analyzer, differential screws 501 can be adjusted to eliminate tilt by moving space transformer 556. Probe points 550-1 to 550-*n* planarity can be measured electronically at a much higher speed than optical measurements, by using the high speed of the switch electronics. This not only speeds up the process of collecting the measurements but it provides rapid snapshots of the interaction of probe points 550-1 to 550-*n* with each other, as they engage the wafer (i.e, the wafer is being pushed against the probe card). This increases the accuracy of the characterization of the probe points and the overall probe card structure interaction with the prober.

Figure 8A:
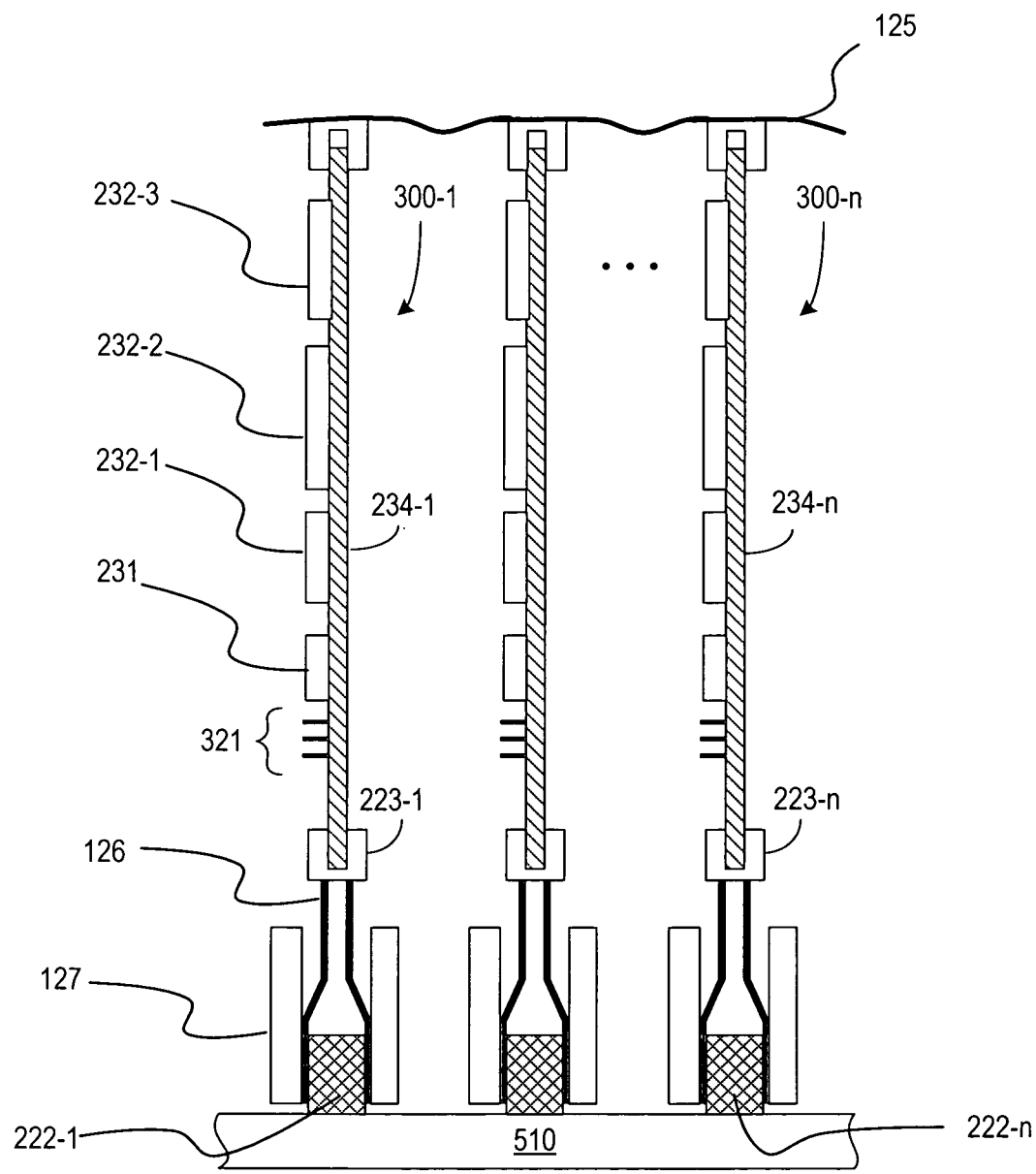
FIG. 8A shows a cross section of a probe card in accordance with an embodiment of the invention having an attached pin card that contains a switch matrix and control register with a flex interface connector.

FIG. 8A shows an end view of a section of a probe card and probe card analyzer, depicting the analyzer's pin cards 300-1 to 300-*n* (generically referred to herein as pin cards 300) connected to probe card's ATE connectors 222-1 through 222-*n* in a 1:1 fashion. Pin cards 300-1 to 300-*n* collectively contain the switch electronics 210 or 210B as described above with reference to FIG. 2A or 2B. Cable 125 can connect pin cards 300-1 to 300-*n* to a control system 750 and to measurement units when meters are not incorporated in pin cards 300-1 to 300-*n*. Each of pin cards 300-1 to 300-*n* includes a PCB 234, a series of switch matrices 231, associated controlling logic 232-1, 232-2, and 232-3, and some other logic used for testing the probe cards. As described further below, each of pin cards 300-1 to 300-*n* may additionally include jumpers 321 or other structures for selecting test options and test channel configurations.

In other embodiments, two or more pin cards 300 could connect to one ATE connector 222, or one pin card 300 can be connected to multiple connectors 222. One embodiment of the invention confines the width of the pin card 300 containing the switches to the length of the ATE connector 222. Another embodiment connects each pin card 300 directly to the corresponding connector 222. Using a pin card 300 with a narrow width allows the center section of PCB 510 to be accessible for planarity adjustments. As shown in FIGS. 7A and 7B, adjustment screws, typically differential screws 501 can be located in the accessible area of PCB 510 and used to planarize the probe card 500 thus minimizing the tilt of probes on the probe card.

Several different structures can be employed to provide a robust connection between pin cards 300 and probe card connectors 222, and the particular structure selected will vary from ATE tester to ATE tester. In the example of FIG. 8A, a flexible circuit or short cable 126 can be attached to the pin card 300-1 through a connector 223-1 on one end of flex circuit 126, and the other end of flex circuit 126 can be clamped onto the connector 222-1 on the probe card using a clamp 127 to facilitate fast on and off handling in gang fashion for all the pin cards simultaneously. Other typical ATE connectors can be gold wiping strips, pogo pins or edge connectors.

Figure 8B:
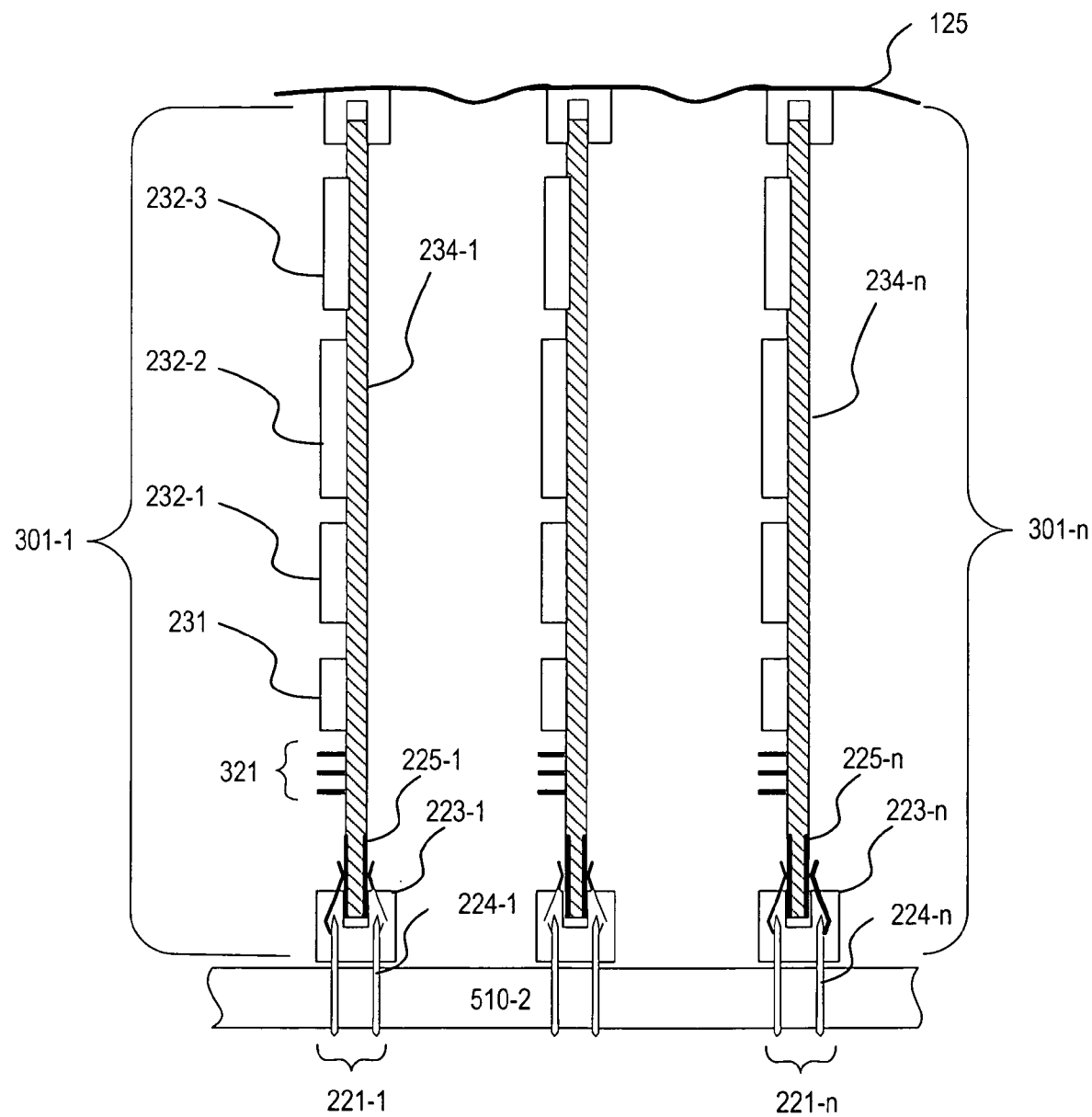
FIG. 8B shows a cross section of a probe card in accordance with an embodiment of the invention having an attached pin card that contains the switch matrix and control register with a direct interface connector.

FIG. 8B is a cross-sectional view of an embodiment of the invention where pin card 301-1 interfaces directly to a connector pin 224-1 in connector 223-1 and making a wiping contact to a conductive (e.g., gold) pad 225-1 on card 234-1. Other embodiments of the invention can be adapted to the type of connector used by ATE suppliers, and generally, the intent is to use the same or similar connectors as those used by the ATE companies. Using ATE supplied connectors is the preferred type of connector for measuring probe card parameters because use of ATE connectors eliminates the longer interface cables traditionally used by conventional probe card analyzers as well as eliminating the variations caused by the use of non-standard connectors for the probe card. Long cables can both reduce the accuracy of electrical measurements of the probe card and can also change the mechanical load on the probe card thus distorting the measurement of physical probe tip locations.

Each ATE connector 222 can have 50 to 500 test channels 221. Since each tester channel 221 requires somewhere between 2 to 6 switches, each pin card 300 would typically require hundreds of switches and a large number of ICs within a very small area. For high density circuitry, most of the analyzer electronics can be in surface mounted packages, which would provide a small, low profile, and cost effective solution.

Figure 9A:
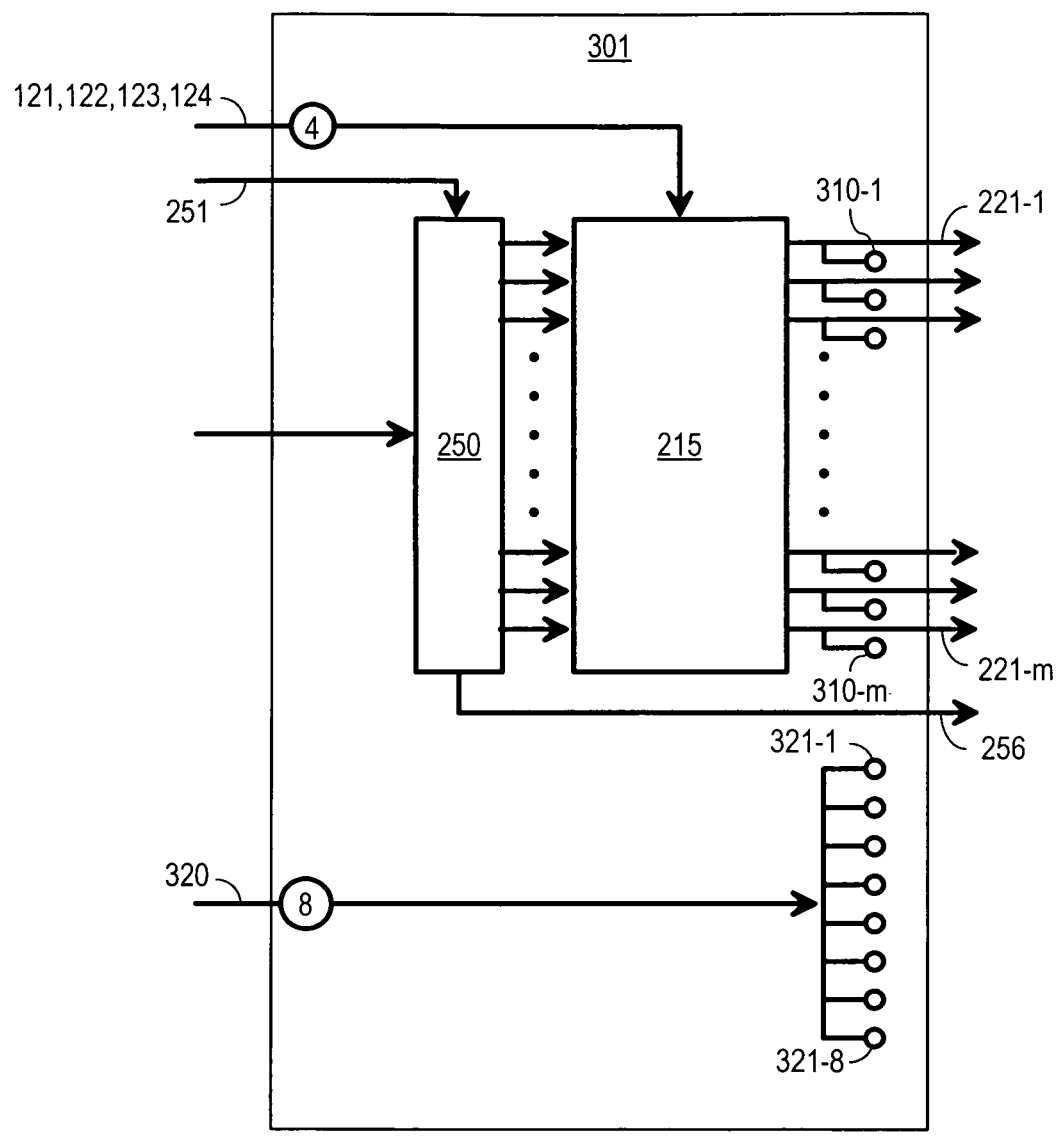
FIG. 9A is a block diagram of a pin card in accordance with an embodiment of the invention.

FIG. 9A shows the block diagram of a pin card 301 designed for a specific ATE, based on a number m of tester channels 221 per connector 222. Pin card 301 of FIG. 9A includes a switch array 215 having switch states set by the value in a shift register 250. Shift register 250 has a data input 251 and a carry output 256 that can be connected to the data input of a shift register in another pin card. Accordingly, only the data input 251 in the first pin card 301 in a chain needs to be connected to the controller system, e.g., controller system 750 in FIG. 2A. The value held in shift register 250 controls which measurement rails 121, 122, 123, and 124 are connected to test channel terminals 221-1 to 221-*m*. Additionally, pin card 301 has control lines 320 connected to jumper pads 321-1 to 321-8. These jumpers can connect to any of the jumper pads 310-1 to 310-*m* respectively coupled to channel terminals 221-1 to 221-*m*. The jumper options thus create permit use of any test channel terminals 221-1 to 221-*m* for control signals.

Figure 9B:
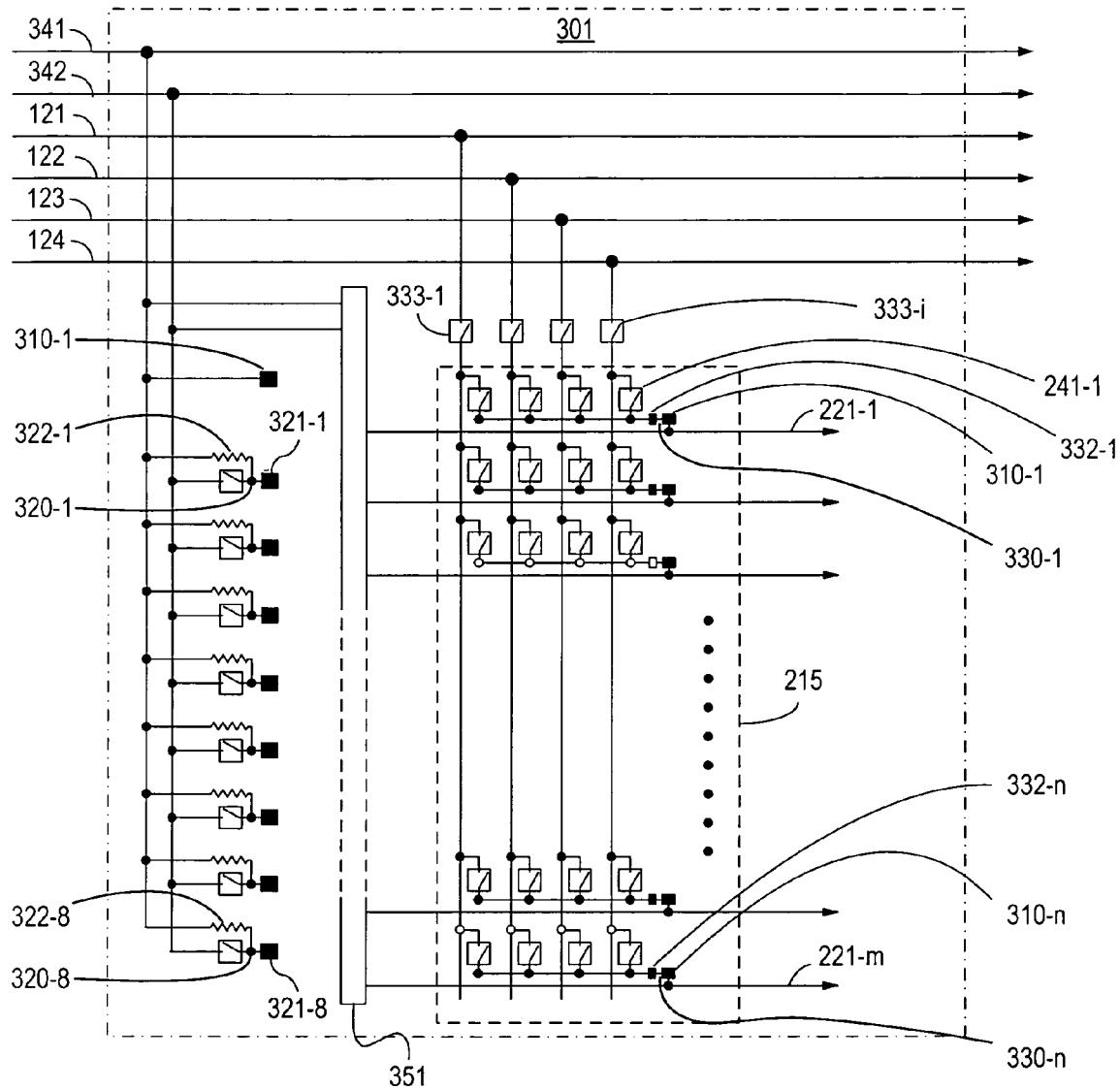
FIG. 9B is a block diagram of a pin card showing jumper pad options for control channels and power rail modifications in accordance with an embodiment of the invention.

FIG. 9B shows a similar pin card 301 in more detail. Pin card 301 contains a switch matrix 215 that is a group of switches that can connect any of the four rails 121, 122, 123, 124 of meter(s) 110 to any of the m test channels 221-1 to 221-*m*. It is preferable that any of rails 121, 122, 123, and 124 can be connected to any test channel. Although embodiments of the invention can use low leakage switches, having tens of thousands of switches on each rail 121, 122, 123, or 124 could still create a large leakage current load. To make the pin card architecture more scalable, rails 121, 122, 123, and 124 can be connected to switch matrix 215 in a pin card 301 through a set of switches 333-1 to 333-*i* (generically referred to switches 333). These switches 333 can isolate the leakage of all the switches in one or more pin cards 301 from the rest of the switch electronics for configurations where none of the switches on the corresponding pin card needs to be closed. Each pin card 301 may have enough intelligence to control the switch matrix 215 connected to its test channels 221 with instructions from the main controller, through a small number of wires shared amongst all the pin cards. The pin card control can be achieved by using FPGAs, microcontrollers, or similar devices (shown as ICs 232-1, 232-2, and 232-3 of FIGS. 8A and 8B) on the pin cards. The communication between the pin card controllers and the main controller can be done with RS232, RS485, USB or similar low wire communication protocols.

Probe card analyzers will increasingly need the ability to test probe cards that have embedded ICs. Most IC memory testers have 12,000 or fewer test channels. In order to test an entire memory wafer at one time with up to 60,000 channels, additional test channels are required. One way to enable a memory tester with limited channels to test more memory ICs in parallel is to multiplex the existing channels to several ICs on the wafer. This can be accomplished by adding switch ICs on the probe card. These ICs must also be tested as part of the probe card analysis. Also, the current high performance and high pin count probe cards often include other custom electronics, such as relays that may be needed to handle switching in high leakage bypass capacitors or other higher current applications. The tester channels 221 that are used for these purposes are commonly called control channels. Additional control and measurement functions are needed on analyzers to test these digital components while not interfering with the traditional measurements. The capability to provide digital control signals to the ICs embedded on the probe card, program voltage levels and option to jumper in different voltages and current carrying capacities are features that are needed by the new probe card analyzers. Since there are no standards used by probe card designers, any tester channel can be used as a control channel. The probe card analyzer generally must treat control channels differently from standard test channels. To provide the highest level of flexibility without adding a lot of complexity, the analyzer controller can provide a few control signals/voltages which are connected to the control channels through jumper wires/connectors. In FIG. 9B, "jumper" pads 310-1 to 310-n on each test channel 221 are configured in such a way that any test channel 221-1 to 221-m can be "jumped" to any of pads 321-1 to 321-8 on control lines 320-1 to 320-8. In the example shown in FIG. 9B, there are eight control lines 320-1 to 320-8 to support a specific memory ATE interface. In other embodiments of the invention, the number of control lines can be increased or decreased to support other ATE architectures and/or customer requirements.

The control line jumpers can also be used to connect different voltage levels to any test channel terminals 221-1 to 221-m. These voltage levels can be supplied from programmable voltage supplies through lines 341 and 342. Typically, the test channels on traditional probe card analyzers are not equipped to drive these circuits properly causing problems in testing probe cards with embedded electronics. The "jumper" options shown in FIGS. 9A and 9B provide a flexible connection for the control signals 320-1 to 320-8 to be connected to the appropriate tester channel terminal 221 to access probe card ICs via the probe card's connectors. The corresponding switches in switch matrix 215 can be programmed to be open so that the control channel is isolated from the DMM rails 121, 122, 123, and 124. To ensure that the switch matrix ICs connected to the same control channel does not get damaged by potentially high voltages and high currents of the control channels, a provision can be made on the PCB for opening the appropriate connection 330-1 to 330-n (by either cutting the trace or removing a jumper connector) thereby isolating switches matrix 215 from some test channel terminals. The cut trace can be repaired if the control configuration requirements changes, by "jumpering" from the affected pad 310 to a corresponding repair pad 332. Since most IC manufacturers tend to adopt a standard scheme for these control channels, these "jumpers" will normally not need to be changed for a particular IC manufacturers using this system. Depending on which ATE interfaces are used with the probe card, there can be from 25 to 250 pin cards 301 in a probe card analyzer.

In some applications, probe card manufacturers will need probe card analyzers with additional capabilities and flexibility that are not required by IC manufacturers. These types of capabilities may require extra control circuitry that will not fit on the pin card 301, since the pin card 301 may have constraints on its physical dimensions. Also adding extra controls to the pin cards 301 may add to the cost of the pin card for all users, who may not need the extra features. For these types of customized features and functions, a daughter card that connects to the pin card 301 through a connector is an effective option. Uncommon switches and control logic can be moved to the daughter cards, reducing the overall cost of the system since only a few daughter cards are needed per probe card configuration and/or standards.

Figure 10:
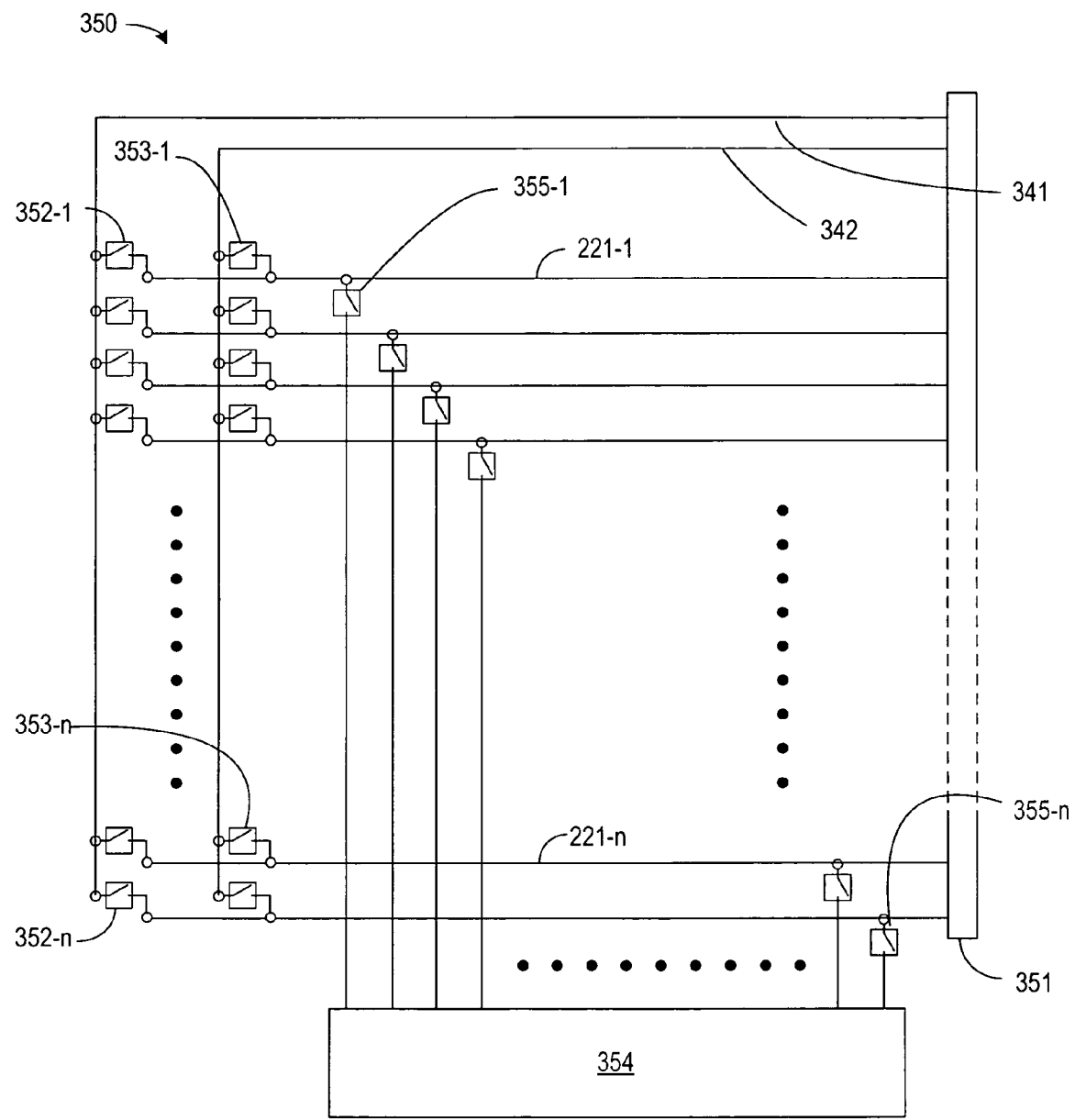
FIG. 10 is a block diagram of a daughter card showing jumper pad for logic signal and relay control options in accordance with an embodiment of the invention.

FIG. 10 shows a schematic for a daughter card 350 that may be connected to a pin card via a connector 351. In this example, daughter card 350 can use switches 355-1 to 355-n that could be the same low leakage types described above to connect the power and control signals from the main controller or the on-board controller 354, to any test channel on the probe card. Controller 354 can be an FPGA, a microcontroller, or a picocontroller in an FPGA that generates logic signals on the daughter card 350 to control switches or control ICs mounted on the probe card being tested. Voltage levels of these logic signals can be controlled by programmable external power supply lines 341 and 342. Reed relays 352-1 to 352-n connect channels requiring high current (>300 mA but typically <2 A) to the externally programmable power rail while reed relays 353-1 to 353-n connect channels requiring low current (<300 mA) to the other external power rails. Although the daughter cards can be connected to the outside world and/or the system controller and power supplies independent from the pin card to which it is attached, the example daughter cards 350 shown in FIG. 10 and FIG. 11 get all their signals and power through connector 351 to create a more robust configuration.

In other configurations for the daughter cards, any tester channels can be jumper wired to high current power supplies through a small number of relays, or a small number of switches for low current power supplies. A customer can design their own version if they cannot find the function and/or feature that they are looking for in the standard product offerings.

Figure 11:
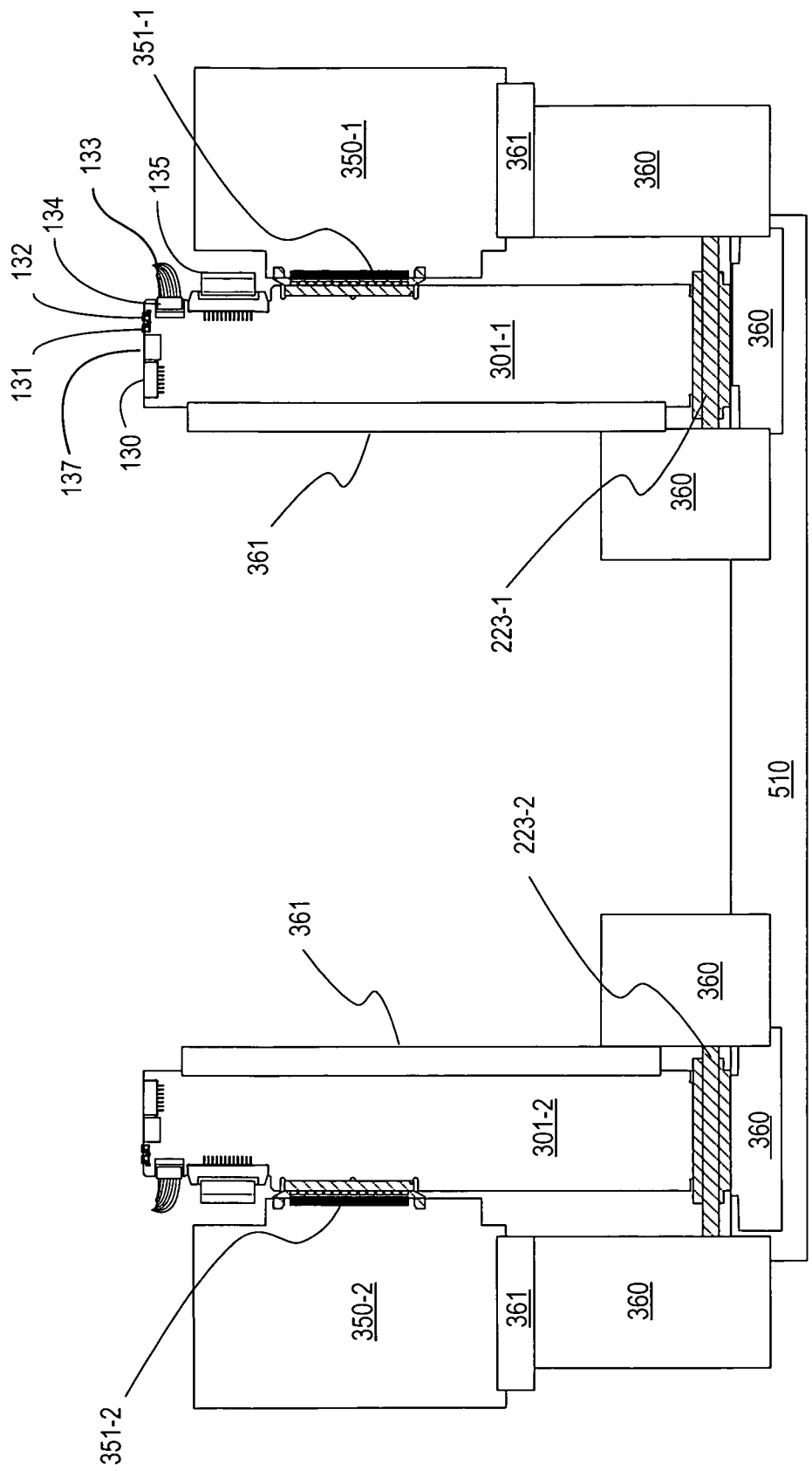
FIG. 11 shows a cross section of a probe card in accordance with an embodiment of the invention having an interface between a pin card and daughter cards and a supporting mechanical frame.

FIG. 11 shows a cross section of a probe card analyzer test head, showing two pin cards 301-1 and 301-2 mounted directly on probe card PCB 510. In some cases, there would be over 100 pin cards mounted around the circumference of PCB 510. Typically, PCB 510 has a diameter of about 440 mm, but future probe cards sizes are expanding to over 500 mm in diameter. Some ATE interfaces for memory testing applications are now using square PCBs that are approaching 1000 mm on a side.

A family of pin cards with ATE specific connector interfaces and ATE specific mechanical frames to hold the pin cards in place on top of probe card that is being analyzed would be preferable over massive number of cables and connectors to allow common use of the switch electronics between ATE interfaces since it reduces the cabling out of the test head from one wire per channel to a few tens of wires irrespective of system channel count.

FIG. 11 shows some common interfaces that many different pin card configurations have in common. Connector 130 can be a JTAG connector used to program the controller (FPGAs) on a pin card 301 or daughter card 350. An ID switch 137 can provide a unique identification for each pin card 301-1 and 301-2. Use of LEDs allows for visually checking pin card status, e.g., a yellow LED 131 and a green LED 132. Power in the system of FIG. 11 is routed as a separate cable 133 to a connector 134. The control signals and source meter measurement rails are routed on a ribbon cable 135 to a connector 136 on each pin card 301. Power cable 133 and the signal flex cable 135 can be grouped and shown as a single flex cable 125 with multiple connectors as shown in FIGS. 8A and 8B. Lower power applications could use a single flex cable implementation. FIG. 11 shows two daughter cards 350-1 and 350-2 respectively connected to pin card 301-1 and 301-2 through connectors 351-1 and 351-2. Frame 360 matches the frame that ATE connectors use for mating to the connectors 223-1 and 223-2 on PCB 510. A frame 361 supports and aligns each pin card 301-1 or 301-2 and associated daughter card 350-1 or 350-2. An analyzer skin which is the protective case can attach to frames 360 and 361. The frames can also provide mechanical connection points for a manipulator to attach and support the analyzer components on the probe card. The manipulator can be designed to hold multiple analyzer heads from different ATE interfaces in a common frame. The manipulator can also be designed to supply the same force on the probe card as the target ATE uses for production IC testing.

Since each pin card 301 and daughter card 350 can have a different set of jumper wires and hardwired configuration, and the control channels are controlling delicate circuitry on the probe cards, it is crucial to ensure that the probe card analyzers are configured correctly before the testing begins. This can be achieved by keeping track of the pin cards and daughter cards' configurations throughout their life in an organization. Just before the test is performed, the analyzer controller interrogates the IDs of the boards and matches the IDs against the required set up. The discrepancies found can be reported and the testing could be halted.

There are several approaches to identifying each unique pin card 301 and daughter card 350. There can be a unique serial number or DNA stored in each controller or FPGA on each pin card and daughter card to uniquely identify each card. The software can read the serial number of the controller on each board and drive a self-test of the board to verify that the jumper wires and daughter cards have the correct configuration. This validates that the configuration was not manually changed by a technician by mistake. Since a typical system will have over 100 pin cards with most being identical but many being unique, it is also critical that the unique pin card is placed in the correct probe card connector position. Even though the software executed in the control system can interrogate the serial number of a pin card and run a self test to ensure the pin card has the proper configuration, this interrogation cannot determine whether the pin card is connected to the proper connectors on the probe card being tested. A manual ID switch is another way to keep track of the position of each pin card, but a manual switch is susceptible to human error in setting the switches correctly. Another scheme for establishing a self ID scheme can be implemented by providing two sequencing wires, one to each of the adjacent boards (one to the left, and one to the right). This wire can be embedded into one of the cables chaining all of the pin cards, such as the power cable. This provides a priority scheme to the boards so that during system initialization, each board can be assigned a board ID via software. This scheme allows the power cable to lock in the priority sequencing of the boards in the system. The first board in the chain will always be enabled. When the software sends a command to assign the first ID code, only this board will respond. It then enables the next board in the chain. The software then sends a command to assign the second ID. Now the second board in the chain will respond. This allows the boards to sequentially respond to successive ID assignment commands and uniquely identify each board in a predefined sequence. This process eliminates the problem of operators manually setting the IDs incorrectly prior to loading the boards in the system. This scheme also provides location information for each of the boards.

In order to measure the physical locations of probe tips, conventional probe card analyzers load probe cards onto their custom mechanical stages which do not flex or bend like a wafer prober and do not have the same range or control of operating temperatures as wafer probers.

The market demand for mobile systems has increased, which has increased the demand for fully tested unpackaged ICs. The production of unpackaged ICs often requires IC manufacturers to test wafers at multiple temperatures that can vary from as low as −55° C. to −10° C. and to as high as 85° C. to 150° C. or even +200° C. Using a probe card at different temperatures causes mechanical movement in the probe card at each operating temperature, which causes probes' physical positions to move and impact the electrical measurements made by the probe card. Very often, the tip planarity (Z position) of a large area probe card will vary with temperature by as much as 50 μm when the temperature changes from room temperature to a target test temperature of 90° C. This is a large variation compared to the typical total over-drive of 75-125 μm and probe tip planarity requirements of 25 μm. (Over-drive is the distance that a wafer is pushed further against the probes after making contact to the last or shortest probe). This thermal planarity or z-direction movement often leads to electrical failures or intermittent failures in actual production IC testing applications. Current probe card analyzer systems cannot report temperature related probe card connection problems at temperature, since their temperature controlled process is not the same as manufacturing test environment.

Also, wafer production testing is performed using a prober that compresses all the probes on the wafer at the same time. This causes the probe card to behave very differently when compared to the testing environment of some of the existing analyzers where the probe tip positions are compressed one at a time for their measurements. Typically these positioning measurements are performed by commercial analyzers on an optically transparent conductive plate and a camera is used to look at the probe tip one at a time to determine both its location and how far the probe will move laterally during compression. The length of the probe tip movement is called a scrub and the resulting mark on an IC wafer pad is called a scrub mark. The location of a scrub mark on an IC pad is a critical measurement because the probe must stay within a restricted area on the pad for a reliable IC testing. If the probe is not centered on a pad or the scrub mark is too long, the probe can damage the IC insulation (or passivation) around the pads and cause a reliability problem. Even if the IC passivation layer is undamaged, scrub marks must be restricted in length because electrical connections are made to the IC pads when the ICs are packaged or employed in a device. Large scrub marks can affect the reliability of the electrical connections to the IC pads. The optically transparent plate used to measure a probe location and scrub in some of the existing analyzers is made of a material such as sapphire that is harder and smoother than the aluminum pads that most IC probe cards contact. Instead of the probe tip digging into the aluminum pad, which restricts its scrub length, the harder sapphire surface does not yield under probe card force and the highly polished plate with a lower coefficient of friction than aluminum pads allows the probe to slide further. These conditions result in optical measurements for scrub marks that are much longer than what is obtained in a real probing environment on a wafer having aluminum pads. Also, in a real application, the first probe to make contact will usually be deflected the most and have the highest force. The last probe to make contact will usually have the least amount of deflection and the lowest force. More recent analyzers such as the ProbeWoRx™ 300 from Rudolph Technologies use a large glass plate with fiducial marks. All the probes are pushed against the glass plate at the same time. The camera below the glass plate is mounted on an X-Y stage, so that the analyzer can scan each probe tip to calculate the probe tip's position relative to the fiducial marks. This scanning is faster than checking individual probes since the probes do not have to be compressed individually for each measurement. Even though all of the probes are compressed for analyzing, the measurements are not accurate because the analyzer's mechanical support and stage control differ significantly from commercial probers and therefore flex differently.

Another critical measurement of a probe card is the depth of its probe mark. Some of the existing analyzers attempt to measure depth of a probe mark by measuring force of the probe point and then correlate the force to predict its depth. This has proven to be inaccurate. Making a reliable contact to aluminum pads on an IC depends on applying and maintaining a minimum probe force to break through the oxides on the aluminum pads and maintain an electrical connection. This minimum force depends on the maximum current that must be supplied through the probe and typically ranges from 0.5 to 1.5 grams for aluminum pads. The maximum force that can be applied to an IC pad must keep from damaging the insulating material or devices located under the pads. The force is also determined by the type of pad material. For example, many ICs use copper traces for interconnect but put a thin layer of aluminum over the copper on the IC pad to enable aluminum wire bonding during packaging. The probe must not break through the aluminum and expose the copper because corrosion of the copper interface can cause long term failure of the wire bond used to package the IC. Typically the maximum force is in the range of 3 to 5 grams per probe points for advanced MEMS probe cards and 10 to 15 grams per probe points for conventional probe cards.

In accordance with an aspect of this invention, a totally different method is used to perform probe card measurements to determine probe tip locations. Instead of measuring the probe tips using a camera on a transparent plate, the probe card can be mounted in a prober in nearly the same way it would be mounted for functional wafer testing and the prober can cause a touch down of the probe card on a blank wafer having a surface of aluminum or other material in which the probes of the probe card will leave scrub marks. For single touchdown memory probe cards, a single contact on a blank aluminum wafer is performed. For multiple touchdown probe cards, multiple contacts at different parts of the blank wafer can also yield chuck tilt characteristics information. The touch downs can be done after the wafer chuck in the prober is brought to a desired temperature and after the probe card has been soaked at that temperature for a desired length of time and is overdriven a specified Z (vertical) distance. These conditions can all be the same conditions that the probe cards are subjected to during normal wafer probing. In general, each probe card manufacturer specifies the amount of overdrive needed for their probe card to make a reliable electrical contact. The overdrive of 25 to 150 µm is what determines the depth of the probe mark and the length of the scrub mark. The probe card touchdown (or touch downs) will imprint scrub marks on the aluminum wafer. The location of each mark relative to the average center of all the marks indicates the tip location of the probe tip, and the length and angle of the probe mark indicates the tip travel of each probe. Since each scrub mark is made with a system at operating temperature, the scrub mark represents the tip positions when the probe card is operating at temperature. Also, the depth of the probe mark or the volume of displaced material in the mark represents force of the probe on the fixture (e.g., on the blank aluminum wafer). After formation of the scrub marks, the aluminum wafer is then measured either in the prober using a camera that is a standard component of the commercial prober used to form the scrub marks or offline using a microscope to determine the width, length, location, and depth of each probe mark. The measurements by forming scrub marks on pad material in the wafer probing environment can be more accurate than measurements that require extrapolation of the probe mark positions after sliding across a low friction transparent plate. The most common pad material is aluminum, but this approach can be used for other target pad materials such as gold, copper, indium tin oxides, and other pad materials. For applications requiring more than one touchdown, the probe card can be stepped across the fixture in the same manner that the probe card would be stepped on the production test floor, and the probe marks can then be measured to reveal differences in the various touchdowns for issues such as chuck tilt. Stepped probe touchdowns across the surface of a fixture in the wafer chuck can also identify subtle issues such as chuck temperature variations when the location of the tips span differently between touchdowns. This probe card test can be used to identify operational problems such as insufficient soak time before testing.

During the compression of the probes on the fixture, e.g., on a blank aluminum wafer, resistance tests described above can be carried out for each increment of vertical compression. The correlation of this data showing resistance versus compression to the scrub length data is very informative in identifying changes in force of each probe which is characterization of the probe's mechanical and electrical behavior and an indication of the reliability and lifetime of the probe. After the electrical testing of the probe card, the scrub marks left on the fixture during the electrical testing can be measured in the manner described above using the camera in the wafer prober or an external optical system.

The accuracy of measuring the scrub mark's depth can be improved by using a confocal microscope like those built by Hyphenated-Systems. The depth of the mark can be measured to nanometers, which is definitive in measuring damage and correlating to force. It is preferred to measure the probe tip position and travel by locating the probe mark at a level just below the aluminum surface and ignoring the pile up of aluminum at the end of the scrub mark since the end of the probe tip's travel is the beginning of the pile up. Use of a confocal microscope at a fixed focus level at just below the aluminum surface can yield the most accurate position measurement and best speed of measurement.

Using the methods described above for performing electrical tests and optical inspections of scrub marks on blank wafers or other fixtures, it is possible to measure contact resistance, probe tip planarity, probe mark locations and probe force data for the non shorted probes on a probe card at the operating temperature of the probe card during wafer probing. This greatly speeds up test time and accuracy of the probe card measurements. The fixture, e.g., aluminum wafer with scrub marks, can be analyzed offline on a microscope freeing up the prober for other production or testing tasks. Since very fast resistance testing is enabled using the test system of this invention and since the test is done in a commercial prober that has the same operating characteristics as the probers used in production, true life testing of a probe card can now become an affordable reality. For life testing, a probe card can be incrementally stepped over the blank aluminum wafer while the contact resistance of each channel is collected or sampled for each step/position. The measurements over a series of touchdowns is very useful in collecting tip wear data, debris build up and electrical reliability data of a probe card and can be quickly obtained by stepping through a series of small steps on the same fixture or wafer having a surface of the target pad material. If a new probe card architecture or technology needs to be characterized for electrical intermittent problems in the probe card or to monitor spring set or breakage then the stepping would be best if performed on a fixture having a surface that is a hard and durable material like tungsten or palladium cobalt. Typically, this type of testing could be for 200,000 to 1,000,000 steps. Multiple step measurements are also useful for tracking down intermittent electrical problems on probe cards that may be pulled from production for exhibiting low die yield.

The fixtures used for the various measurements in some embodiments of the invention can be silicon wafers typically coated with aluminum or other metals with a composition and thickness similar to product DUT wafers. This provides a test environment for the probe tip as close as possible to the wafer probing environment. A metal surface layer of a fixture can be customized according to the specific pad metallurgy of the targeted product DUT wafer. The cost of the silicon wafer can be recovered by recycling used wafers by simply etching the surface, e.g., imprinted aluminum, layer and recoating the silicon wafer. In addition, since these silicon wafers provide a purely mechanical purpose, they do not have to be at the quality for IC processing. This also allows the wafer cost for fixtures to be lower than wafer costs for production ICs.

The power and ground probes for a given die site on a probe card are typically bussed together. Therefore, the contact resistance test of any of the individual spring or other probe if measured on a blank aluminum wafer will yield the parallel resistance of all the springs connected to that power or ground channel. It is desirable to know the contact resistance of each power and ground probe since the failure of a single probe can change the current supplied to a localized area of the IC or change the voltage drops on an IC which causes test rejects in production IC wafer testing. Some of the existing probe card analyzers use a check plate that contains an isolated contact dot or multiple parallel strips isolated from each other which is connected to the measurement meter under the plate. Each of the power or ground probes are positioned over this isolation dot or strip so that its contact resistance can be measured. This is typically a rather slow measurement since each probe must be positioned over this dot in turn and compressed. The test time is dominated by the number of mechanical movements needed to align the individual power and ground probes and not by the electrical measurement times.

Figure 12:
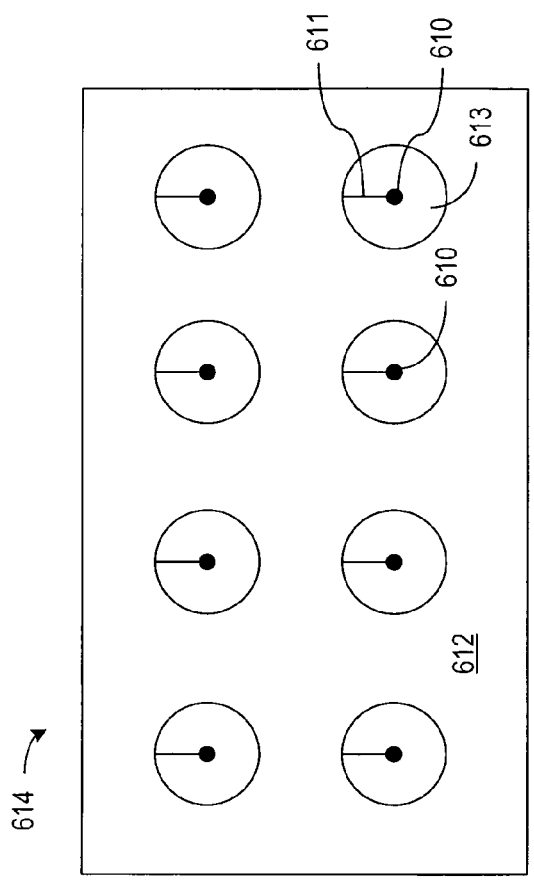
FIG. 12 shows a pattern for an isolation wafer in accordance with an embodiment of the invention having layout with generic isolation dot pattern for measuring contact resistance of power and ground probes.

Some embodiments of this invention utilize an isolation plate or isolation silicon wafer using patterns such as the one shown in FIG. 12, to perform the isolation measurement. FIG. 12 shows an isolation plate 614 having a conductive layer that is patterned to form one or more isolation dots 610. The underlying structure of plate 612 can be a silicon die or wafer, a ceramic die or wafer, or an isolation plate of a relatively non-conductive material, so that regions 613 around each isolation dot 610 are relatively non-conductive. Isolation plate 614 can be a wafer and loaded into the prober through the wafer handler and held in place on the prober wafer chuck 715 in the same manner that IC wafers are loaded onto the prober for testing. Alternatively, isolation plate 614 could be attached to a silicon wafer for auto-loading or manually mounted on the attachment to the wafer chuck 715. Since testing is within the prober's environment, electrically connecting to each isolated dot 610 through the probe card may be simpler than using a return path through the wafer or plate. In the illustrated embodiment, each isolation dot 610 connects through a trace 611 to a conductive (e.g., metal) field region 612. A measurement circuit can thus be completed by contacting a probe to be tested to an isolation dot 610 and contacting other probes that are not part of the same bussed group as a return path to field region 612.

Non-conductive regions 613 between isolation dot 610 and the surrounding field region 612 can be made larger than the largest expected die size or the largest grouping of bussed probes, so that a probe positioned on dot 610 is guaranteed to be isolated from all the other probes at the same die site or in the same group of bussed channel because the bussed probes will be in region 613 and not make contact to field metal 612. Only the probes from other die sites or outside the set of bussed probes will make contact to field metal 612. Therefore, isolation dot 610 enables contacting a probe that is isolated from the other probes on the same bussed net. By keeping each dot 610 small enough so that the dot 610 will not contact more than one probe at a time, it is possible to measure the contact resistance between the target channel and a few channels from one or more adjacent die sites. It is preferable to cover the trace 611 connecting the dot 610 to the field metal 612 with an insulating layer such as an oxide. This insulation is not mandatory if the stepping is controlled so that no probe will contact trace 611.

There can be one or many similar dots 610 on a patterned wafer or plate. A patterned wafer or plate can use aluminum for the patterned layer, but using rhodium or palladium cobalt would provide a longer useful lifetime for fixture 614 since probe marks would not damage the dots made of harder and more durable material. This isolation wafer or plate 614 can have a custom pattern so that the dot pattern matches the die site pitch of the DUT wafers tested by the probe cards to be analyzed. Patterned wafers are more expensive than blank plates to manufacture but become cost effective when running a higher volume of probe cards since fewer mechanical steps may be required to test each probe card. The custom wafer approach allows the same probe of every die site to be tested in parallel at the cost of fabricating this custom wafer. Alternately, if the dot pitch does not match the die site pitch, it may still be preferable to have multiple dots so that the stepping distance of the wafer can be reduced. Based on the typical die sizes of ICs being tested, it is possible to design standard isolation wafers and isolation plates that can be reused for probe cards that probe different IC pad patterns. Software used with isolation plate 614 generally needs to be intelligent enough to control the wafer stepping in order to accurately place a power or ground probe only on an isolation dot 610 before performing a resistance measurement performed, for example, using the techniques described above.

Figure 13:
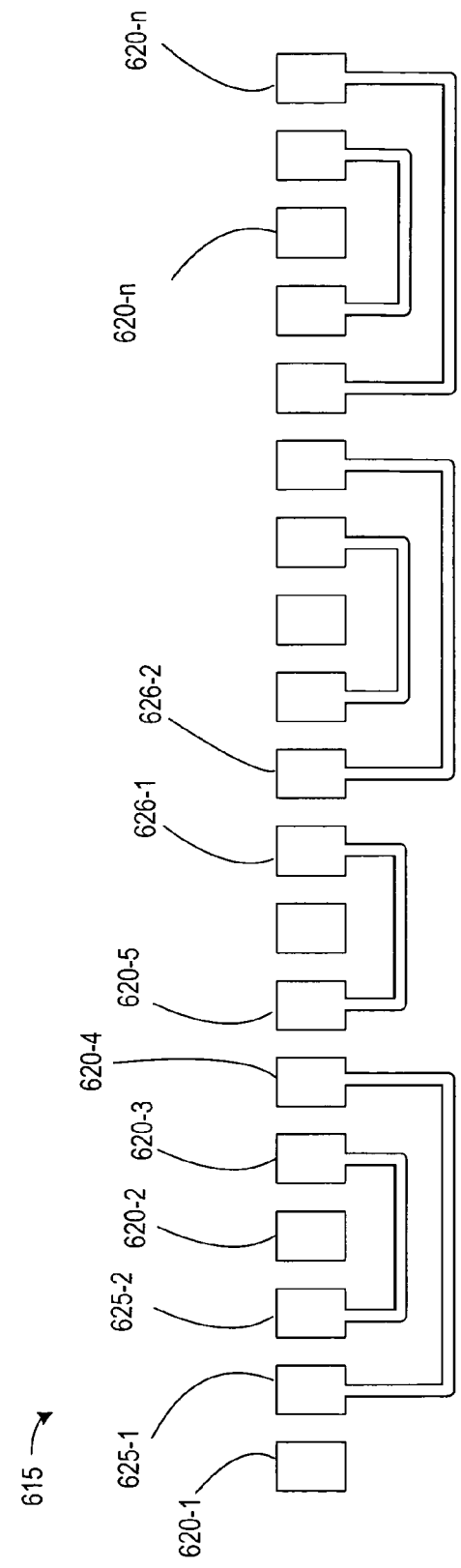
FIG. 13 shows a pattern for an isolation wafer in accordance with an embodiment of the invention for measuring contact resistance of power and ground probes.

FIG. 13 shows an alternate pattern 615 for the contact pads of an isolation wafer or plate. Here, the isolation wafer or plate is custom for the target probe card where there are separate pads 620-1 to 620-n, 625-1 to 625-n, and 626-1 to 626-n respectively for all probes on the probe card. Pads 625-1 to 625-n are referred to as power pads and are positioned to contact probes through which the probe card supplies power to an IC. Pads 626-1 to 626-n are referred to as ground pads and are positioned to contact probes through which the probe card grounds pads on an IC. In the conductive pattern 615 of the isolation plate, each of power pads 625-1 to 625-n or ground pads 626-1 to 626-n is electrically connected to one or more separate signal pads 620-1 to 620-n. For example in FIG. 13, power pad 625-1 is routed to a signal pad 620-4, and ground pad 626-1 is routed to a signal pad 620-5. There are usually more signal pads than power and ground pads in most devices. Use of pattern 615 can allow the isolation tests of bussed power and ground probes to be completed in a single touchdown by measuring the resistance between the signal channel and the connected power, ground, or bussed probe's channel. Since the signal probe can be verified first, the verified signal probes can be used to verify the bussed probes.

A drawback to the custom isolation wafer is the cost of tooling to form the desired pattern, especially if a pattern for a full 300 mm or larger wafer is needed. This cost can be greatly mitigated by limiting the isolation pattern to a single or few die sites on cheaper 4" or 6" wafer, and dicing the pattern to dies that are just the size of an IC or multiple ICs to be tested with the probe card. The dies with isolation patters for one or a few ICs can be from a semiconductor (e.g., silicon) wafer or on a ceramic material. The dies with isolation patters can then be mounted on a blank wafer for automatic handling in the prober.

Figure 14:
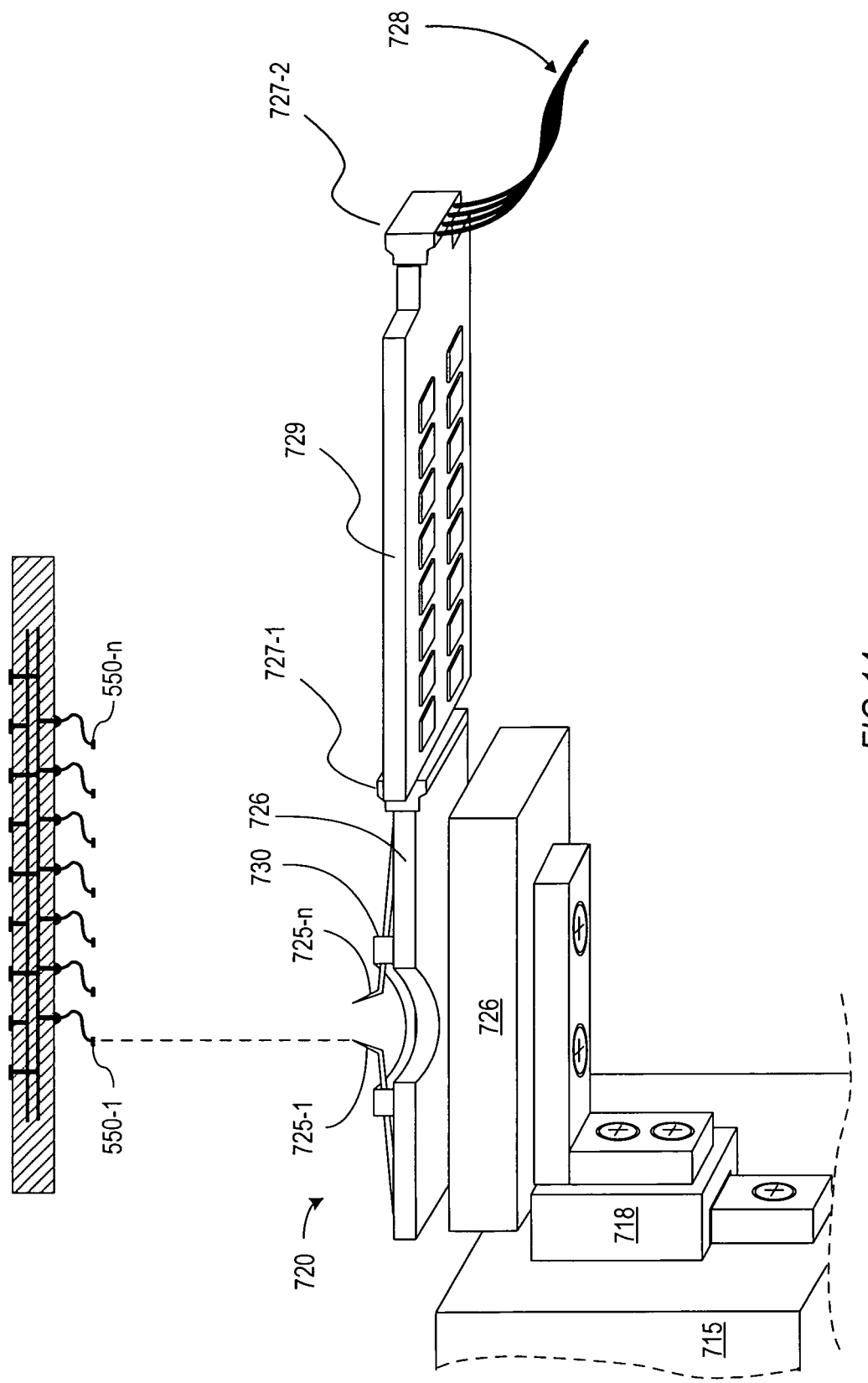
FIG. 14 shows an embodiment of the invention including an isolation probe mounted on a prober chuck

An alternative to using isolation wafers is to use a custom isolation probe such as isolation probe card 720 shown in FIG. 14. Isolation probe card 720 is mounted on either the wafer chuck 715 that is part of a wafer prober or an attachment 718 added to the wafer chuck 715 of the wafer prober. This isolation probe 720 has individual needles 725-1 to 725-$n$ that match the locations of only the bussed probes 550-1 to 550-$n$ on one or more die sites of the target probe card to be tested. The isolation probe card can be built using a standard PCB 726 with a connector 727-1 to a small isolation pin electronics card 729. Each target probe can be connected to a pair of the measurement rails F− and S− or F+ and S+ through the analyzer pin electronics card as described above, and each isolation probe 725 is tied to another pair of the measurement rails F+ and S+ or F− and S− through cable 728 and a connector 727-2 on the isolation pin electronics card 729. The isolation pin electronics card 729 plugs directly into the isolation probe card 720 and minimizes the number of cables from the control system and meters needed to control and operate isolation pin electronics card 729 and isolation probe card 720. This approach enables a simple and rapid resistance measurement of each bussed probe. For example, in FIG. 14, isolation probe 725-1 could contact target probe 550-1 for a resistance measurement or electrical planarity measurement of probe 550-1. The resistance measurement is the sum of the resistances of isolation probe 725-1 and probe 550-1, but the resistance of isolation probe 725-1 can be independently measured and subtracted from the total resistance reading to provide the resistance of probe 550-1. Isolation pin electronics card 729 switches measurement rails connected to the isolation probe 725 and can be controlled by the system controller 750 through cable 728.

For a target application of testing a memory probe card, the bussed pins on one die of a wafer can range from 2 to over 60 probes. There can be from 400 to over 1600 memory die per wafer. A typical DRAM application would have 20 bussed pins per die and 800 die per wafer. For a single touchdown memory probe card application, the isolation probe card 720 could have 20 isolation pins 725 and can be stepped to each die site (800 steps) to measure the resistance and planarity of each bussed probe 550-1 to 550-20 on the target probe card. In this example, when compared to testing one bussed probe per step, there would be 20 less steps per die site to test bussed probes or a total of 16,000 fewer steps to measure all of the bussed probes on the probe card. This is a significant speed improvement over using single isolation dots for the measurements of bussed probes.

An isolation probe card 720 has advantages over patterned isolation wafer 615. The advantages include lower manufacturing costs, shorter fabrication times and the ability to still isolate individual bussed probes even when the probes are bussed (shorted) between several die sites on the probe card. The isolation probe card 720 can be designed to probe more than one die site at a time to improve its throughput.

The isolation probe card 720 is shown constructed as a traditional tungsten needle card on a PCB 726 because this is a low cost approach for building the isolation probe card 720. Although a traditional needle card with a PCB was described as the structure for building the isolation probe, other probe cards structures may be more suitable for measuring tighter pitch or lower force probes. These structures could include vertical buckling beam probes, pogo pins, membrane probes, flex circuits, MEMS probes on PCB or ceramic interconnect substrates. To reduce the number of steps in testing a probe card, the isolation probe card can be made to include all the pins (bussed or not) on its structure, thus making a complete resistance measurements of all the probes in one or more die sites.

Figure 15:
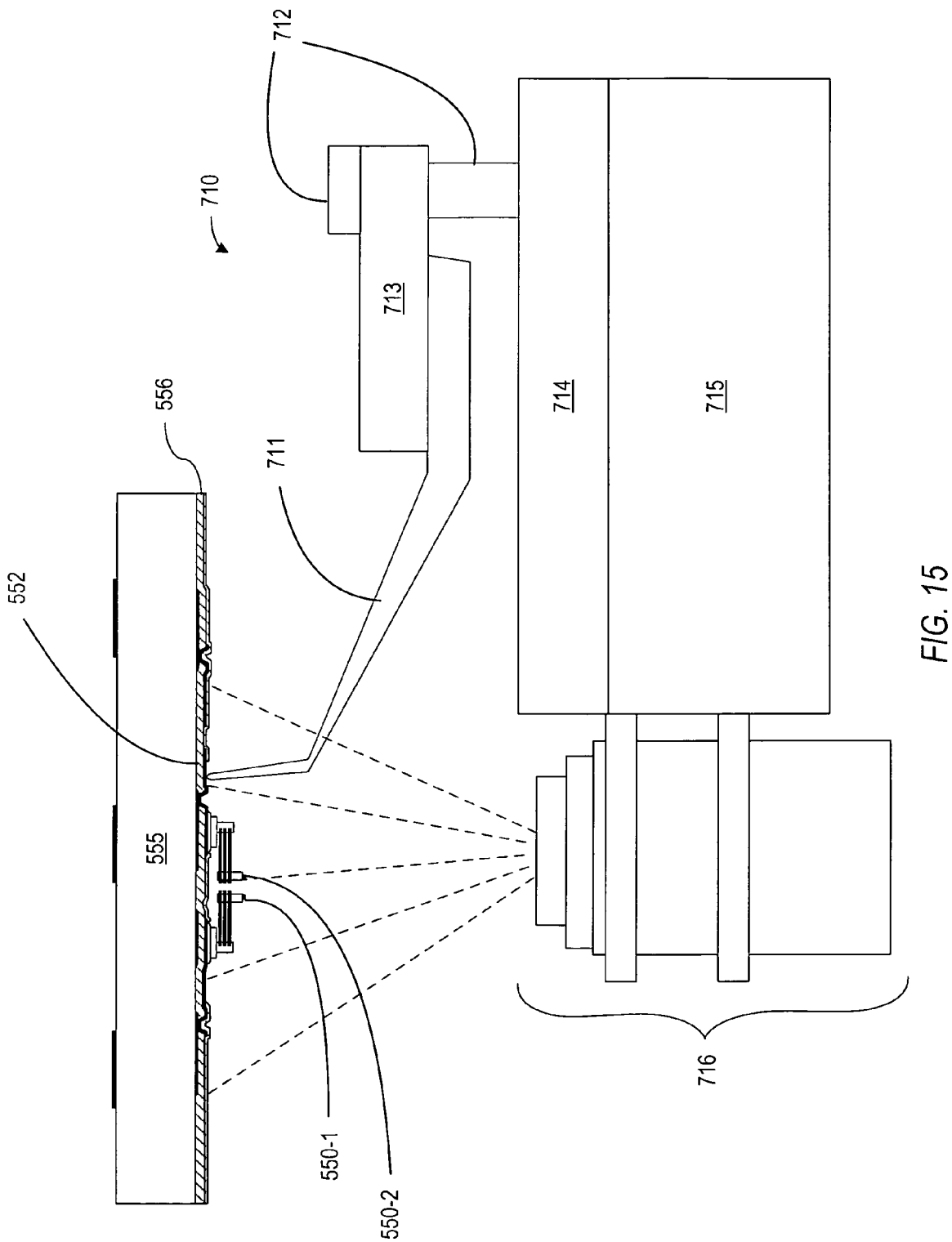
FIG. 15 shows an embodiment of the invention having a diagnostic probe mounted on a prober chuck.

Another aspect of the invention is the use of a diagnostic probe shown in FIG. 15. A diagnostic probe card 710 can be mounted either directly on the wafer chuck 715 of the wafer prober or an attachment to the chuck 715 of the wafer prober. This diagnostic probe card 710 has a single probe 711 that can be used to contact a target probe tip like 550-1, a probe pad, a monitor pad, a logic control pad, or a trace 552 on a space transformer of the probe card to be tested. Diagnostic probe card 710 can even monitor the voltages and signals on the terminal of components such as capacitors and ICs mounted on the probe card. Diagnostic probe card 710 is driven by the wafer stage to the desired pad location or tip to be tested and raised to make electrical contact. An upward looking camera 716 can be mounted to the wafer stage to allow a live view of the probe 711 making contact to the test point. This enables an operator to manually move and align the diagnostic probe 711 to the target test point. The diagnostic probe card 710 if attached to the chuck 726 will have an independent vertical mechanism 712 so that the probe 710 can be lowered below the surface of the prober chuck 715. This would allow diagnostic probe 711 to be moved out of the way, so that probe 711 would not interfere with probing wafers on the probe chuck 714. The diagnostic probe 711 is useful for making measurements that cannot easily be made by the probe card analyzer. For example, if a probe was measured as having high resistance, the problem could be with the probe or the trace getting to the base of the probe. The diagnostic probe 711 can be positioned to measure the resistance at the probe tip or the base of the probe. Another use of diagnostic probe 711 is to help monitor and validate the operation of ICs and other components mounted on the probe card. Probe pads can be provided on the space transformer 556 to monitor digital signals being generated by the ICs. Points can also be provided to measure the voltage level supplied to the ICs and noise on the power and ground lines. By utilizing a dual tip high frequency diagnostic probe, high frequency measurements for characterizing the probe card can be achieved. This greatly simplifies the task of Time domain Reflectometry (TDR) characterization of probe cards and enables AC characterization of multiple channels on the probe card which has always been a much desired but unaffordable tedious task. The diagnostic probe can also access and drive control pads on the probe cards, where the signal and function could not be brought out through the regular probe card's test channels.

Conventional probe card analyzers typically measure probe force by using a micro spring gauge where each probe of the probe card is pushed one at a time to measure its force. This measurement is relative to first touch, which is when the probe tip makes first electrical contact to the force gauge. This measurement provides the spring constant of each probe but not the contact force of the probe when the whole probe card is engaged to the DUT wafer. FIG. 15 shows a diagnostic probe card 710 that can be mounted on prober wafer chuck 715 or attachment to the chuck 715. The spring constant of diagnostic probe 711 can be calibrated, so that when diagnostic probe 711 sequentially pushes against each probe spring 550-1 to 550-$n$ by incrementally raising chuck 715, the spring constant of each probe card spring 550 being tested can be determined. This can be accomplished by measuring the deflection of diagnostic probe 711. The force can then be calculated for each probe 550. This approach may not be as accurate as measuring the volume of probe marks, but some users would like to have both measurements available to improve correlation between force and probe mark and also to maintain continuity with historical force measurements.

The diagnostic probe card 710 and isolation probe card 720 can be mounted onto a platform that is a wafer or has similar features to wafers. This is done to further automate the process of changing probes cards 710 and 720 for different probe card 510 designs. The probe cards 710 and 720 can be kept and carried to the prober in a standard wafer container. They could even share the container with a wafer used for contact resistance and probe mark inspections. The wafers, diagnostic probes, and isolation probes can be moved in and out of the wafer chuck area using the prober's automated handling mechanism.

Figure 16:
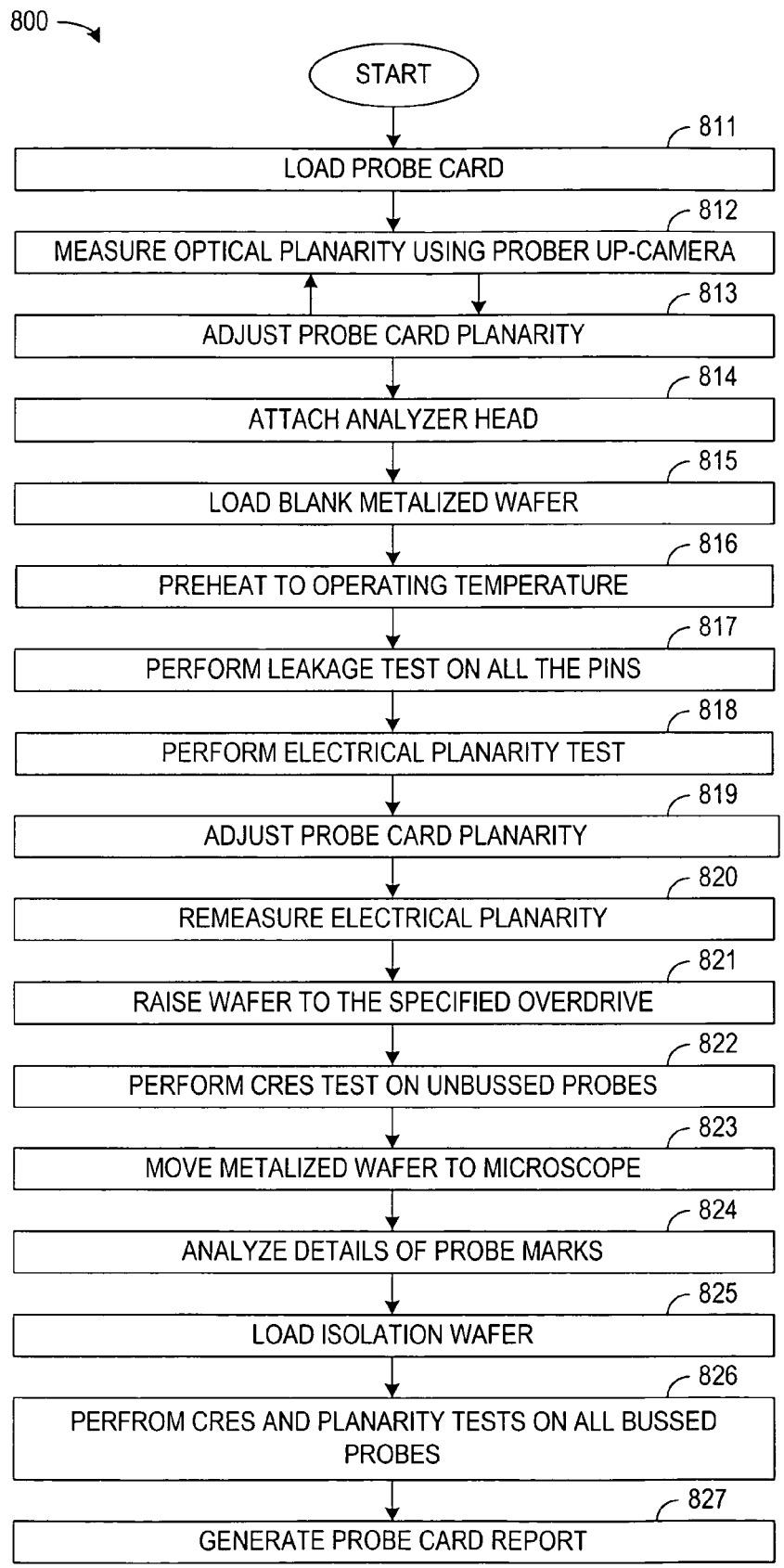
FIG. 16 is a flow diagram of a probe card test in accordance with an embodiment of the invention.

A simplified test flow 800 which can be used for analyzing probe cards is shown in FIG. 16 and described with reference to FIG. 16 and the analyzer structure of FIG. 2A. The analysis process starts in step 811 by loading the probe card 500 to be tested on to the prober 700. Step 812 then measures the planarity of the probe card. In particular, prober 700 generally has an upward looking camera that may be mounted on the wafer chuck 715. The camera can scan a sub-set of the probe tips 550-1 to 550-n to measure their Z locations. Typically, the camera can only measure planarity to within a few microns and this is a relatively slow process, so only a subset of the probes, less than 5%, are usually measured. The user can select to run a full Z-profile of the probe tips, if needed. The step 812 thus determines the gross tilt of the probe card 500 which can be reduced in step 813 by adjusting screws 501 of FIG. 7A. Planarity measurement step 812 and adjustment step 813 can be repeated if desired to further improve planarity.

The analyzer switch electronics 200 mounted in its frame is lowered in place on top of probe card 500 in step 814. This step 814 can use a commercial manipulator 760 of FIG. 17. Manipulator 760 can be the same equipment used to attach an ATE head or can be modified, for example, to house some of the devices such as power supplies or measurement electronics. The connections to the pin cards 301-1 thru 301-n as shown in FIG. 8B are made by mating connectors 223-1 thru 223-n to traces 225-1 thru 225-n on the pin cards.

The next step 815 of process 800 is to load a blank conductive wafer, which serves as fixture 600, onto the wafer chuck of the prober. The wafer chuck is preheated to the desired operating temperature in step 816. The analyzer can then perform a leakage test in step 817, with all of the probes of probe card 500 floating in air above the wafer chuck and fixture 600.

The next step 818 is to perform electrical planarity by raising the prober in small steps (i.e., 0.1 μm steps or smaller) while checking to see if each individual signal pin (or test channel) has made electrical contact with the conductive wafer (fixture 600). Once the last pin has come into contact with fixture 600, the tilt and the profile of the probe card probes can be determined. A full characterization of the probe points and their interaction with respect to each other can be developed by mapping and correlating the planarization data and the resistance data at each step. A fine adjustment to the tilt can be performed by lowering the chuck and adjusting screws 501 on the probe card which is step 819. Once the fine adjustment has been optimized the depth of each probe is measured and the planarity of the signal pins IDs determined in step 820. The wafer chuck is then raised to the specified probe overdrive in step 821, and probe contact resistance is measured on all non-bussed probes in step 822.

The contact resistance testing with overdrive creates scrub marks in fixture 600 for each probe. The scrub marks can be used to determine the probe x-y locations and the volume of the marks which relates to force and pad damage. These scrub marks will be measured, for example, using a microscope. Step 823 moves fixture 600 from the prober to a microscope for measurement of the scrub marks. Step 824 can measure x-y positions and paths of the scrub marks and depths and volumes of the scrub marks. The measurement of the x-y locations of scrub marks can be performed with a conventional microscope, but measurement of the volume may need to be performed using a confocal microscope in step 824. Instead of removing the fixture in step 823, the microscope used to measure scrub marks can be mounted on the prober 700.

Analysis of scrub marks in step 824 can include comparing the locations of the scrub marks to a database indicating the positions of pads on the IC to be probed with the probe card. Since the fixture can be a blank wafer, the location of pads may not be indicated on the blank wafer, but a best fit process can match the scrub marks to the location of the pads indicated in the database. Analysis of the scrub marks can then determine whether any of the scrub marks extend outside of what would be the boundaries of a target pad on an IC being probed.

The next step 825 is to load either the isolation wafer, isolation plate or isolation probe into place for bussed probe testing. The bussed probes have contact resistance and electrical planarity measurement performed in step 826. All the information is now in place to generate the probe card analysis report in step 827.

Figure 17:
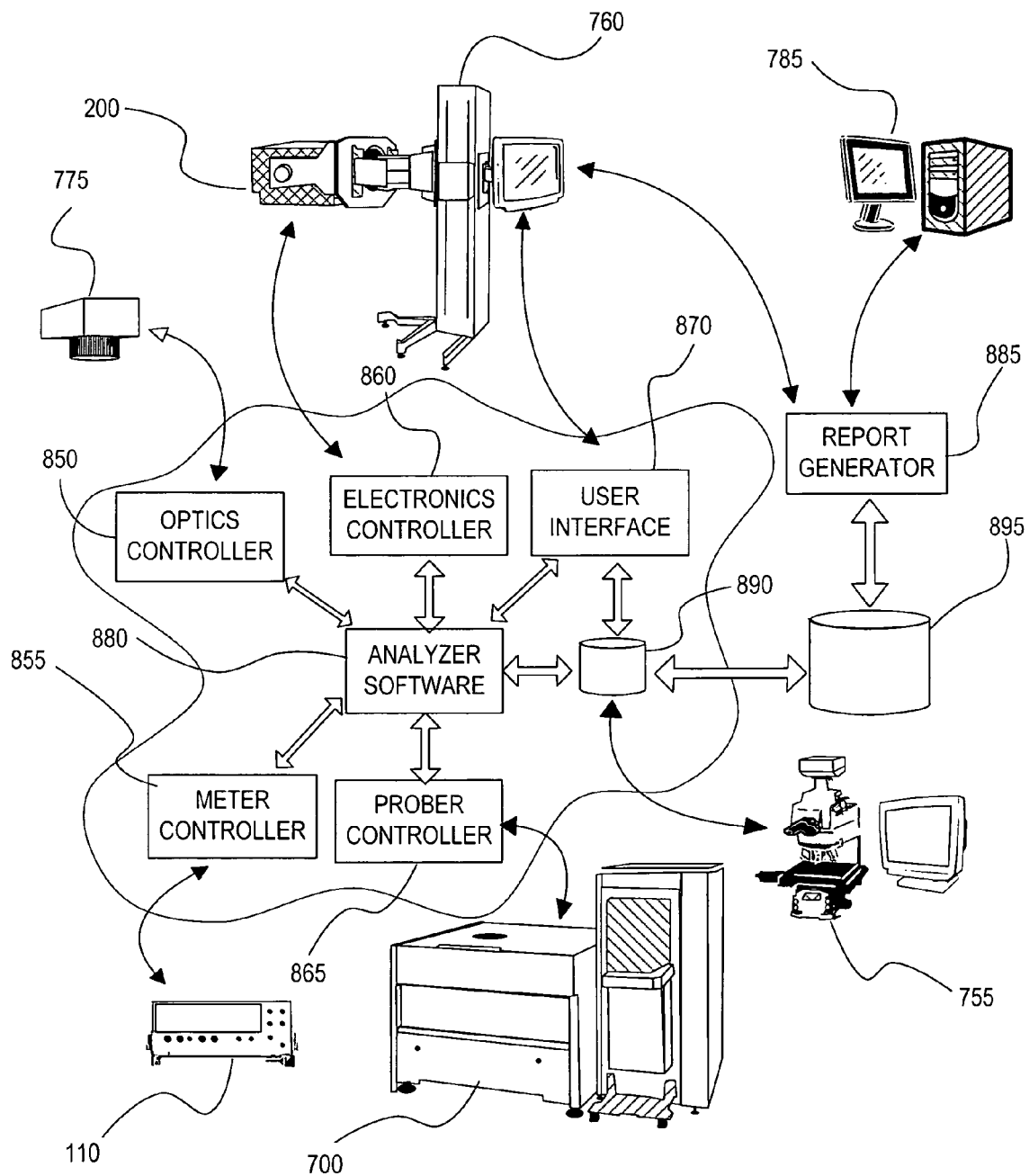
FIG. 17 illustrates hardware-software relationships in accordance with an embodiment of the invention for analyzing probe cards and generating reports.

FIG. 17 illustrates a top level relationship of analyzer software 880 to the modules that control the hardware, store data, and generate reports in a probe card analyzer in accordance with an embodiment of the invention. A meter control 855 drives the source meter(s) 110 to perform the measurements and upload readings. An optics controller 850 moves the fixture with scrub marks to the appropriate locations to capture images needed for tip positioning and volume measurements. Optics controller 855 can also receive and store video images from an integrated confocal or standard camera 775 or an external confocal or standard microscope 755. A prober controller 865 controls the stage movement, wafer loading and unloading, wafer alignment, temperature control and the camera for optical planarity and probe tip inspections in prober 700. In some cases, a downward looking camera 775 will also be controlled for scrub mark x-y position analysis. An electronics controller 860 communicates with the switch control electronics 200 by generating test vectors, test sequences and running diagnostics of the pin and daughter cards. A user interface module 870 enables the user to program the prober, analyzer software and access an analyzer data base 890 or a main data base 895. A report generator 885 creates analysis reports based upon customer specifications. These reports can include drill down dashboard reports, graphical representations of the measurements against specs, trend reports from multiple measurements of the probe card, and statistical correlations of probe card measured parameters to the yield of IC being tested, which can be viewed, printed, or further processes through an independent computer system 785.

Although the invention has been described with reference to particular embodiments, the description is only an example of the invention's application and should not be taken as a limitation. Various adaptations and combinations of features of the embodiments disclosed are within the scope of the invention.

We claim:

1. A system for analyzing properties of a probe card, the system comprising:
   a wafer prober in which the probe card is placed;
   switch electronics electrically connected to the probe card;
   a measurement unit electrically connected to the switch electronics, wherein the measurement unit comprises a 4-wire resistance meter that performs measurements through four measurement rails, and wherein the measurement unit through the switch electronics is able to perform measurements of a probe that the switch electronics selects from among a plurality of probes on the probe card; and
   a fixture that is held on a wafer stage in the wafer prober and brought into contact with the probe card by the wafer prober.

2. The system of claim 1, wherein the switch electronics contains switches electrically connecting the probe card to the measurement unit such that each electrical channel on the probe card can be selectively connected to any of the four measurement rails of the measurement unit.

3. The system of claim 2, wherein the switch electronics controls a pattern of on/off states of the switches to change the on/off states in synchronization with measurements taken by the measurement unit such that a next pattern is loaded while a previous pattern is being used by the measurement unit and the next pattern is applied when a previous measurement is complete and a next measurement is initiated.

4. The system of claim 1, wherein the measurement unit consists of a single measuring device.

5. The system of claim 1, wherein the switch electronics comprise one or more switch matrix cards, with each switch matrix card having one or more DUT connectors matching ATE connectors on the probe card.

6. The system of claim 5, wherein the DUT connectors on the switch matrix cards are connected directly to the ATE connectors on the probe card.

7. The system of claim 5, wherein each of the switch matrix cards comprises a controller.

8. The system of claim 1, wherein the switch electronics comprises a plurality of substantially identical switch matrix cards that are connected to the probe card.

9. The system of claim 1, further comprising a manipulator system that holds and supports the switch electronics.

10. The system of claim 9, wherein the manipulator system applies a load to the probe card to emulate mechanical deflections caused when an ATE test head is connected to the probe card during wafer probing.

11. The system of claim 1, wherein the fixture comprises a wafer with an unpatterned conductive surface that the wafer prober brings into contact with the probes on the probe card.

12. The system of claim 1, wherein the fixture comprises a wafer with a conductive film having a pattern.

13. The system of claim 12, wherein the pattern of the conductive film includes a field region and one or more pads, each of the pads being surrounded by an isolation region except where a trace connects the pad to the field region.

14. The system of claim 13, wherein the measurement unit measures one probe that is in contact with one of the pads using a return path through another probe in the probe card that is in contact with the field region.

15. The system of claim 1, wherein the fixture comprises a wafer with a conductive film having a pattern that comprises a plurality of pads and traces, wherein the pads are in positions that correspond to positions of the probes on the probe card, and each of the pads that correspond to bussed probes is electrically coupled through one of the traces to one of the pads corresponding to non-bussed probes.

16. The system of claim 1, wherein the fixture comprises:
   a wafer; and
   a substrate mounted on the wafer, wherein the substrate has a size matching one or more die sites of the probe card and has a conductive metal pattern on an exposed surface such that there are metal pads matching the probes on the probe card, wherein the pads matching bussed probes are electrically connected to pads matching non-bussed probes.

17. The system of claim 1, wherein the fixture comprises an isolation probe card, wherein the isolation probe card has isolation probes placed facing the probes on the probe card and in a pattern that matches a pattern of the probes on the probe card for one or more die sites, and the fixture is mounted in the wafer prober such that the isolation probes can be brought into contact with the probes on the probe card.

18. The system of claim 1, wherein the switch electronics comprises:
   a switch matrix connected between the measurement unit and test channels of the probe card; and
   control resources including one or more controllers capable of driving integrated circuits embedded on the probe card; wherein
   the switch matrix is operable to connect the control resources to one or more of the test channels, whereby one or more of the test channels can be converted into control channels.

19. A system for analyzing properties of a probe card, the system comprising:
   a wafer prober in which the probe card is placed;
   switch electronics electrically connected to the probe card, wherein the switch electronics comprises a plurality of substantially identical switch matrix cards that are connected to the probe card, and wherein each of the switch matrix cards stores a board ID representing a position of the switch matrix card position on the probe card, the board ID being initialized by software and a single wire connection between adjacent switch matrix cards;
   a measurement unit electrically connected to the switch electronics, wherein the measurement unit through the switch electronics is able to perform measurements of a probe that the switch electronics selects from among a plurality of probes on the probe card; and
   a fixture that is held on a wafer stage in the wafer prober and brought into contact with the probe card by the wafer prober.

20. A system for analyzing properties of a probe card, the system comprising:
   a wafer prober in which the probe card is placed;
   switch electronics electrically connected to the probe card, wherein the switch electronics comprise one or more switch matrix cards, with each switch matrix card having one or more DUT connectors matching ATE connectors on the probe card, and wherein the switch electronics further comprises one or more daughter card connectors allowing the one or more daughter cards to electrically connect to the one or more switch matrix cards and electrically connect to the DUT connector pins on the one or more switch matrix cards to which those daughter cards are connected;
   a measurement unit electrically connected to the switch electronics, wherein the measurement unit through the switch electronics is able to perform measurements of a probe that the switch electronics selects from among a plurality of probes on the probe card; and a fixture that is held on a wafer stage in the wafer prober and brought into contact with the probe card by the wafer prober.

21. The system of claim 20, wherein each daughter card contains resources that can be selectively connected to the DUT connector pins.

22. The system of claim 21, wherein the resources are configurable to control integrated circuits and relays on the probe card or provide power and ground to the probe card.

23. A system for diagnostic measurement of a probe card, the system comprising:
a wafer prober in which the probe card is placed;
switch electronics electrically connected to the probe card;
a measurement unit electrically connected to the switch electronics, wherein the measurement unit through the switch electronics is able to perform measurements of a probe that the switch electronics selects from among a plurality of probes on the probe card; and
a diagnostic probe containing one or more probe tips, the diagnostic probe being mounted on a chuck stage of the wafer prober; wherein the diagnostic probe can be moved laterally and vertically relative to the probe card to bring the diagnostic probe tip into contact with any desired location on the probe card including probe tips on the probe card, terminals of components on the probe card and electrical contacts on the probe card.

24. The system of claim 23, wherein the probe tips of the diagnostic probe can be electrically connected to measurement rails of the measurement unit so that the test channels selected for measurement can include the diagnostic probe as one of the test channels.

25. The system of claim 23, further comprising a second measurement unit electrically connected to the probe tips of the diagnostic probe.

* * * * *